US007225171B2

(12) United States Patent
Kikuchi et al.

(10) Patent No.: US 7,225,171 B2
(45) Date of Patent: May 29, 2007

(54) AIR CONDITIONING EQUIPMENT OPERATION SYSTEM AND AIR CONDITIONING EQUIPMENT DESIGNING SUPPORT SYSTEM

(75) Inventors: Hiroshige Kikuchi, Chiyoda (JP); Tadakatsu Nakajima, Chiyoda (JP); Keiji Sasao, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 429 days.

(21) Appl. No.: 10/445,057

(22) Filed: May 27, 2003

(65) Prior Publication Data

US 2003/0192328 A1 Oct. 16, 2003

Related U.S. Application Data

(62) Division of application No. 10/066,667, filed on Feb. 6, 2002, now Pat. No. 6,591,620.

(30) Foreign Application Priority Data

Oct. 16, 2001 (JP) ............................ 2001-317570

(51) Int. Cl.
*G01R 11/56* (2006.01)
*G01M 1/38* (2006.01)

(52) U.S. Cl. ...................................... 705/412; 700/276

(58) Field of Classification Search ................ 705/412, 705/1, 7, 8, 10, 26, 400; 379/102.03, 102.05, 379/102.07; 700/295, 276; 702/61, 188, 702/62; 165/238–248, 267–269

See application file for complete search history.

(56) References Cited

U.S. PATENT DOCUMENTS 4,314,454 A 2/1982 Kamejima et al.

(Continued)

FOREIGN PATENT DOCUMENTS

JP 409021557 A * 1/1997

(Continued)

OTHER PUBLICATIONS

Arjuello-Serrano et al. Nonlinear Control of a Heating, Ventilating, and Air Conditioning System with Thermal Load Estimation. IEEE Transactions on Control Systems Technology, vol. 7, No. 1, Jan. 1999; pp. 56-63; Abstract, pp. 1-2.*

(Continued)

*Primary Examiner*—Igor N. Borissov
(74) *Attorney, Agent, or Firm*—Antonelli, Terry, Stout & Kraus, LLP.

(57) ABSTRACT

A control server includes a device information database storing device characteristic data constituting the air conditioning equipment, a fuel/power rate database storing price and rate data regarding gas, oil, power and the like, a device characteristic and price database, an air conditioning equipment simulator for calculating running costs by using the data stored in the fuel/power rate database, and communication portion for performing communications through a network. The control server, and an air conditioning management controller for managing and controlling the air conditioning equipment provided with the communication portion for performing communications through the network, are connected to the network. An operation plan is made by the control server, the operation plan is transmitted to the air conditioning equipment management controller for controlling the air conditioning equipment through the network, and the air conditioning equipment is controlled and operated according to the operation plan.

6 Claims, 19 Drawing Sheets

U.S. PATENT DOCUMENTS

| | | | | |
|---|---|---|---|---|
| 5,598,349 | A | 1/1997 | Elliason et al. | |
| 5,621,662 | A * | 4/1997 | Humphries et al. | 700/276 |
| 5,634,011 | A * | 5/1997 | Auerbach et al. | 709/242 |
| 5,924,486 | A | 7/1999 | Ehlers et al. | |
| 6,160,993 | A | 12/2000 | Wilson | |
| 6,216,956 | B1 | 4/2001 | Ehlers | |
| 6,454,177 | B1 * | 9/2002 | Sasao et al. | 236/46 R |
| 6,859,831 | B1 * | 2/2005 | Gelvin et al. | 709/224 |
| 7,039,575 | B2 * | 5/2006 | Juneau | 703/18 |
| 2002/0022991 | A1 | 2/2002 | Sharood et al. | |
| 2002/0026417 | A1 * | 2/2002 | Murata et al. | 705/40 |
| 2002/0070937 | A1 | 6/2002 | Kawamura | |
| 2002/0072868 | A1 * | 6/2002 | Bartone et al. | 702/62 |
| 2002/0103655 | A1 | 8/2002 | Boles et al. | |
| 2002/0124992 | A1 | 9/2002 | Rainer et al. | |
| 2002/0128987 | A1 | 9/2002 | Namba | |

FOREIGN PATENT DOCUMENTS

| | | | |
|---|---|---|---|
| JP | 410267452 | A * | 10/1998 |
| JP | 2001-280674 | | 10/2001 |

OTHER PUBLICATIONS

*The Handbook of Air-Conditioning, Refrigeration and Sanitary Engineering*, SAREK (The Society of Air-conditioning and Refrigerating Engineers of Korea), pp. 186-188 and 511-515 (1991).

* cited by examiner

FIG.13

| No. | NAME | TYPE | NUMBER |
|---|---|---|---|
| 1 | COOLING TOWER 1 | AAA | X |
| 2 | COOLING WATER PUMP 1 | BBB | X |
| 3 | FREEZER 1 | CCC | X |
| 4 | COLD WATER PRIMARY PUMP 1 | DDD | X |
| 5 | HEAT EXCHANGER 1 FOR OUTSIDE AIR COOLING | EEE | X |
| 6 | COOLING TOWER 2 | FFF | Y |
| 7 | COOLING WATER PUMP 2 | GGG | Y |
| 8 | FREEZER | HHH | Y |
| 9 | COLD WATER PRIMARY PUMP 2 | III | Y |
| 10 | HEAT EXCHANGER 2 FOR OUTSIDE AIR COOLING | JJJ | Y |
| • | • | • | • |
| • | • | • | • |
| • | • | • | • |
| | | | |
| | | | |
| | | | |

AIR CONDITIONING EQUIPMENT OPERATION SYSTEM AND AIR CONDITIONING EQUIPMENT DESIGNING SUPPORT SYSTEM

CROSS-REFERENCE TO RELATED APPLICATION

This application is a divisional of Ser. No. 10/066,667 filed 6 Feb. 2002 and issued as U.S. Pat. No. 6,591,620 B2.

BACKGROUND OF THE INVENTION

The present invention relates to an air conditioning equipment operation system for operating air conditioning equipment, and a designing support system for designing and supporting the air conditioning equipment.

An example of conventional air conditioning equipment is described in JP-A-8-86533. The air conditioning equipment described in that document is constructed by combining absorption and compression air conditioners. During application of a low load, the absorption air conditioner is first operated. When an air conditioning load exceeds a maximum load of the absorption air conditioner, the absorption and compression air conditioners are both operated.

In addition, JP-A-7-139761 describes a system for operating a cooling tower when an outside air temperature detected by outside air temperature detecting means is lower than an indoor temperature detected by indoor temperature detecting means, in order to efficiently use energy in a clean room by using the cooling tower.

In the case of the air conditioning equipment described in JP-A-8-86533, an absorption freezer is operated with priority, and then a compression freezer is operated according to a load. However, in the air conditioning equipment described therein, the freezer to be operated is only changed to another according to cooling capability. Sufficient consideration is not always given to reductions in costs for operating each freezer by taking a characteristic thereof into consideration.

In the case of the system described in JP-A-7-139761, when the outside air temperature is low, switching is made to the operation of the cooling tower. However, since cooling capability of the cooling tower is greatly dependent on a humidity condition of an outside air, the capability of the cooling tower may not always be used satisfactorily, or cooling by the cooling tower may be impossible.

SUMMARY OF THE INVENTION

The present invention was made to remove the foregoing inconveniences of the conventional art, and it is an object of the invention is to operate air conditioning equipment by reducing running costs. Another object of the invention is to reduce costs for air conditioning equipment including initial costs. Yet another object of the invention is to provide cold water at low costs. A further object of the invention is to achieve at least one of those objects.

In order to achieve the foregoing object, a feature of the invention is that in an air conditioning equipment operation system where a service provider company operates air conditioning equipment installed in a contract site, the service provider company sets full load or partial load running for a turbo freezer and/or an absorption freezer based on annual air conditioning load fluctuation data and/or weather data, in such a way as to minimize the total running costs of the turbo freezer and/or absorption freezer provided in the air conditioning equipment.

In this case, the total running costs may include costs of a cooling tower for radiating heat generated in a clean room accommodating a production unit of the air conditioning equipment, and heat generated by the production unit. The service provider company may control the air conditioning equipment of the contract site through a public line or Internet, and obtain the weather data from a weather forecast company through the public line or the Internet.

In order to achieve the foregoing object, another feature of the invention is that in an air conditioning equipment operation system where air conditioning equipment provided in a contract site is operated by a service provider company, the service provider company has a control server, which includes a device information database storing a device characteristic data of an air conditioner constituting the air conditioning equipment, a fuel or electricity rate database storing rate data of at least one of gas, oil and electric power, and an air conditioning equipment simulator for obtaining a partial load factor, and at least one selected from consumption of power and consumption of fuel during partial load running by using the device characteristic data and a cycle simulator, and calculating running costs from the obtained consumption of power and/or the obtained consumption of fuel by using the rate data. The contract site includes an air conditioning equipment management controller provided to manage and control the air conditioning equipment. The control server and the air conditioning equipment management controller are connected to each other through a network. The control server predicts a cooling load from predictable time series data on a temperature and humidity of outside air by referring to the device information database, and then makes an operation plan of the air conditioner. The air conditioning equipment management controller operates the air conditioner according to the operation plan.

In this case, the air conditioning equipment simulator calculates running costs for each operation of the air conditioner, and makes operation plan data by an operation method having lowest running costs among the calculated running costs; the air conditioning equipment includes absorption and turbo freezers, and the air conditioning equipment simulator selects full or partial loads of the freezers according to a set amount of cooled heat of the absorption and turbo freezers, and calculates running costs in this case; the air conditioning equipment includes a cooling tower, and the air conditioning equipment simulator calculates running costs according to the operation/stop of the cooling tower; an object to be cooled provided in the air conditioning equipment is cooled by cold water generated by a cold water generator of the service provider company, a temperature sensor for detecting a cooled heat amount of this cold water is provided in the vicinity of the object to be cooled, and the air conditioning equipment simulator obtains an amount of heat for colling from a temperature detected by the temperature sensor, and calculates a use rate of the contract site; the control server predicts a cooling load from prediction data on a temperature and humidity of an outside air purchased from a weather forecast company, and the air conditioning equipment simulator sets an operation method of the air conditioning equipment in the air conditioning equipment management controller through a web based on the predicted cooling load; means may be provided for detecting the temperature and humidity of the outside air, means may be provided for detecting a cooling load of the air conditioning equipment, an equation of relation between the cooling load and the temperature and humidity of the outside air may be obtained from the temperature and humidity of the outside air, and the cooling load detected by the detecting means, and a cooling load may be predicted by using this equation of relation.

In order to achieve the foregoing object, yet another feature of the invention is that an air conditioning equipment designing support system for supporting designing of a number of air conditioners provided in air conditioning equipment comprises: a step (A) of generating an annular cooling load fluctuation pattern of the air conditioning equipment; a step (B) of calculating initial costs by referring to a device information database storing device characteristics and prices of the number of air conditioners; a step (C) of calculating annual running costs from the annual cooling load fluctuation pattern by referring to the database storing the device characteristics and the prices, and a database storing fuel and electricity rates; a step (D) of calculating costs including device taxes and interest rates; and a step (E) of calculating total costs including the initial costs, and running costs of a set number of years. By changing the configuration of the air conditioners of the air conditioning equipment, and repeating the steps (B) to (E), each air conditioner of the air conditioning equipment is set in such a way as to minimize the total costs.

In this case, preferably, an annual cooling load pattern is produced by using a weather information database storing weather data on a past temperature and humidity of an outside air.

In order to achieve the foregoing object, a further feature of the invention is that in an air conditioning equipment operation system where air conditioning equipment provided in a contract site is operated by a service provider company, an object to be cooled in the air conditioning equipment is cooled by cold water generated by a cold water generator of the service provider company, a cooled heat amount of this cold water is obtained from outputs of a temperature sensor and a flow meter installed in the vicinity of the object to be cooled, and a use rate is obtained by calculating this obtained cooled heat amount with a predetermined rate.

Other objects, features and advantages of the invention will become apparent from the following description of the embodiments of the invention taken in conjunction with the accompanying drawings.

BRIEF DESCRIPTION OF THE DRAWINGS

FIG. 13 is a view showing an example of a device configuration data set.

DESCRIPTION OF THE EMBODIMENTS

Figure 1:
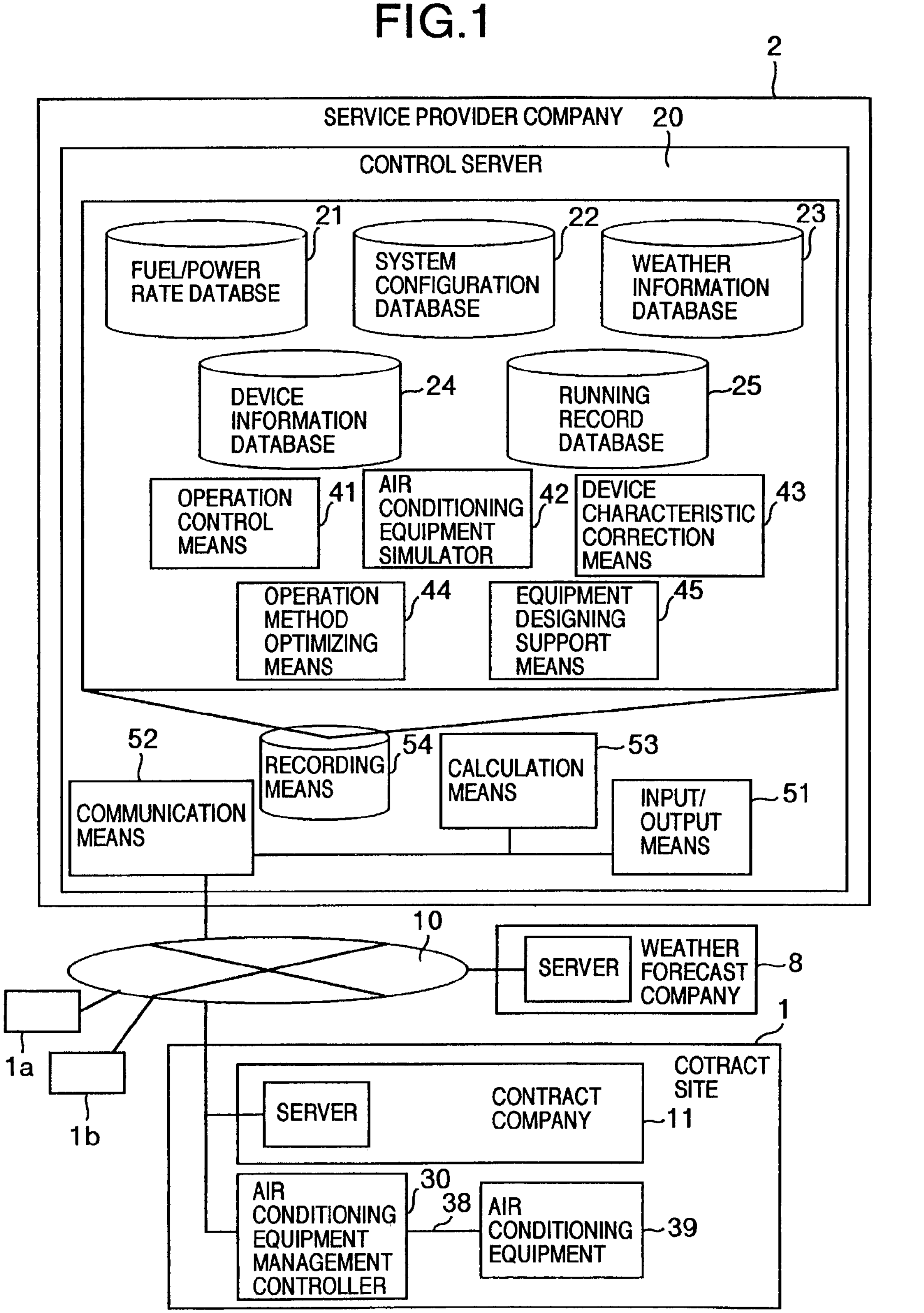
FIG. 1 is a block diagram showing an air conditioning equipment operation system according to an embodiment of the present invention.

Next, description will be made of the embodiments of the present invention with reference to the accompanying drawings. FIG. 1 shows an entire configuration of an air conditioning equipment operation system according to an embodiment of the invention. In the air conditioning equipment operation system, a service provider company 2 is connected to contract sites 1, 1*a* and 1*b* through a network 10. The service provider company 2 has a control server 20. Various bits of information stored in the control server 20 are transmitted to/received by an air conditioning equipment management controller 30 of the contract site 1 through the network 10. In the contract site 1, an air conditioning equipment communication line 38 is connected to enable data to be transmitted from the air conditioning equipment management controller 30 to each device constituting air conditioning equipment 39 or received from each device.

The service provider company 2 has a weather forecast information provision contract with a weather forecast company 8. Weather forecast data is provided from the weather forecast company 8 to the service provider company 2 through the network 10. The weather forecast data is prediction data containing a temperature and humidity of an outside air. The service provider company 2 makes an operation plan for the air conditioning equipment 39 of the contact site 1 by using the weather forecast data of the weather forecast company 8. Based on this operation plan, the air conditioning equipment controller 30 manages and controls the air conditioning equipment 39. Cold water is supplied from the air conditioning equipment 39 to a contract company 11, and each room of the contract company 11 is air-conditioned, or a device is cooled. A relation between the contract site 1 and the contract company 11 is set, for example in a manner that the contract company owns a plant or a building, and takes air conditioning equipment including running control on lease or the like from the contract site 1. Accordingly, the contract site 1 is responsible for entire management of an air conditioner of the contract company 11.

The control server 20 of the service provider company 2 has hardware including communication means 52 for controlling communications through the network 10, input/ output means 51 including a display, a keyboard, a mouse and the like, storage means 54 such as a hard disk, and calculation means 53 such as a microcomputer. The control server 20 also includes a fuel/power rate database 21, a device information database 24, a system configuration database 22, a running record database 25, a weather information database 23, operation control means 41, an air conditioning equipment simulator 42, device characteristic correction means 43, operation method optimizing means 44, and equipment designing support means 45.

The device information database 24 stores characteristic and price data on devices constituting the air conditioning equipment 39 connected to the air conditioning equipment management controller 30. These data include device characteristic and price data provided from a manufacturing company of each device, and device characteristic data corrected by the device characteristic correction means 43 based on running record data of such a device. The fuel/power rate database 21 stores a gas rate of a gas supply company 4, a power rate of a power supply company 5, and an oil sales price of an oil selling company 6 from the past to the present.

The weather information database 23 stores weather data including a temperature, humidity and the like. The weather data includes data such as AMEDAS (Automated MEteorological Data Acquisition System) provided by Meterological Agency, and weather forecast data forecast by the weather forecast company 8. Each weather forecast data is transmitted from the weather forecast company 8 to the contract sites 1, 1*a* and 1*b* through the network 10, and stored in the weather information database 23.

The running record database 25 stores running record data of the air conditioning equipment 39 installed in the contract site 1. The running record data is obtained by recording data measured by a measuring device attached to each part of the air conditioning equipment, and a running start/stop signal of each device in time series. This running record data is transmitted from the air conditioning equipment management controller 30 periodically or according to a request of the control server 20.

The system configuration database 22 stores system configuration data of the air conditioning equipment of each of the contract sites 1, 1*a* and 1*b*. As the system configuration data of the air conditioning equipment, there are configuration information and connection information of each device of the air conditioning equipment.

The running control means 41 controls transmission of operation plan data of the air conditioning equipment to the air conditioning equipment management controller 30 through the network 10, stores and manages the running record data of the air conditioning equipment 39 received from the air conditioning equipment management controller 30 through the network 10 in the running record database 25, calculates a rate to be charged to the contract company 11 from the running record data, calculates rates to be paid to the weather forecast company 8, the power supply company and the gas supply company, and manages a state of money input/output. The running plan data of the air conditioning equipment contains a running start/stop command, and a target control value of each device provided in the air conditioning equipment.

The air conditioning equipment simulator 42 simulates an air conditioner installed in the contract site 1. Software loaded in the air conditioning equipment simulator 42 includes a program for calculating a load rate of a pump or a freezer to be used from the information of the device connected to the air conditioning equipment 39, a program for calculating an exchanged heat amount of a cooling coil or a dry coil provided in the air conditioning equipment 39, and a temperature of water or air in an outlet of the cooling coil or the dry coil, a program for calculating an amount of exchanged heat, and a temperature in an outlet of the heat exchanger, a program for simulating a freezing cycle of the freezer, and a program for calculating a cooled heat amount of the cooling tower, and a temperature of cold water in an outlet of the cooling tower.

The air conditioning equipment simulator 42 calculates a partial load rate, consumption of power and consumption of fuel of each device from data on, for example a temperature and humidity of an outside air, a cooling load and a control target value of each device, by referring to the device characteristic data stored in the device information database 24, and the air conditioning equipment system configuration data of the contract site 1 stored in the device configuration database 22. In addition, the air conditioning equipment simulator 42 calculates running costs following the consumption of power and the consumption of fuel by referring to the power rate data, the gas rate data and the oil price data stored in the fuel/power rate database.

When fuel consumption of the absorption freezer 32 and power consumption of the turbo freezer 33 are calculated from the cooling load, if a parameter value necessary for calculating a freezing cycle such as heat transfer performance of an evaporator or a condenser provided in each freezer is known, the consumption of power is calculated by using a cycle simulator. If such a parameter value necessary for freezing cycle calculation is not known, the consumption of power is calculated by using a relation between the cooling load and the power consumption of the turbo freezer 33, described later with reference to FIG. 15.

The device characteristic correction means 43 corrects device characteristic data of the air conditioning equipment by referring to the running record data of the air conditioning equipment stored in the running record database 25, and then stores the corrected data in the device information database 24. A change made in the device characteristic because of deterioration of the device is recorded. The operation method optimizing means 44 searches a method for operating the air conditioning equipment installed in the contract site 1 so as to minimize running costs, and makes running plan data. The equipment designing support means 45 searches an air conditioning equipment configuration, which reduces total costs including initial costs, running costs, maintenance costs, and disposal costs, when designing or replacing the air conditioning equipment.

A planning engineer of the service provider company 2 makes an operation plan, a maintenance plan, or a replacement plan for the air conditioning equipment 39 provided in the contract sites 1, 1*a* and 1*b* by using the control server 20, and designs air conditioning equipment for a new contract site. The control server 20 of the service provider company 2 stores the fuel/power rate database 21, the device information database 24, the system configuration database 22, the running record database 25, and the weather information database 23. When the air conditioning equipment of the new contact site is designed, if there is a contract site currently using a similar device or having used the similar device in the past, and data accumulated in this contract site can be used, the air conditioning equipment can be designed in detail by using the accumulated data.

Since the device characteristic including the running record data of the other contract site using the similar device can be examined, a more accurate operation plan can be made. In addition, when maintenance is necessary, if the similar device is used, a similar running history tendency is exhibited. Thus, when similar devices are used by a plurality of contract sites, a maintenance plan can be made by using the stored past running history tendency needing maintenance. As contract conditions of fuel power rates are stored en block in the fuel/power rate database 21, by selecting a period of small fuel or power consumption so as to consume more fuel or power, fuel or power can be bought at low costs.

Figure 2:
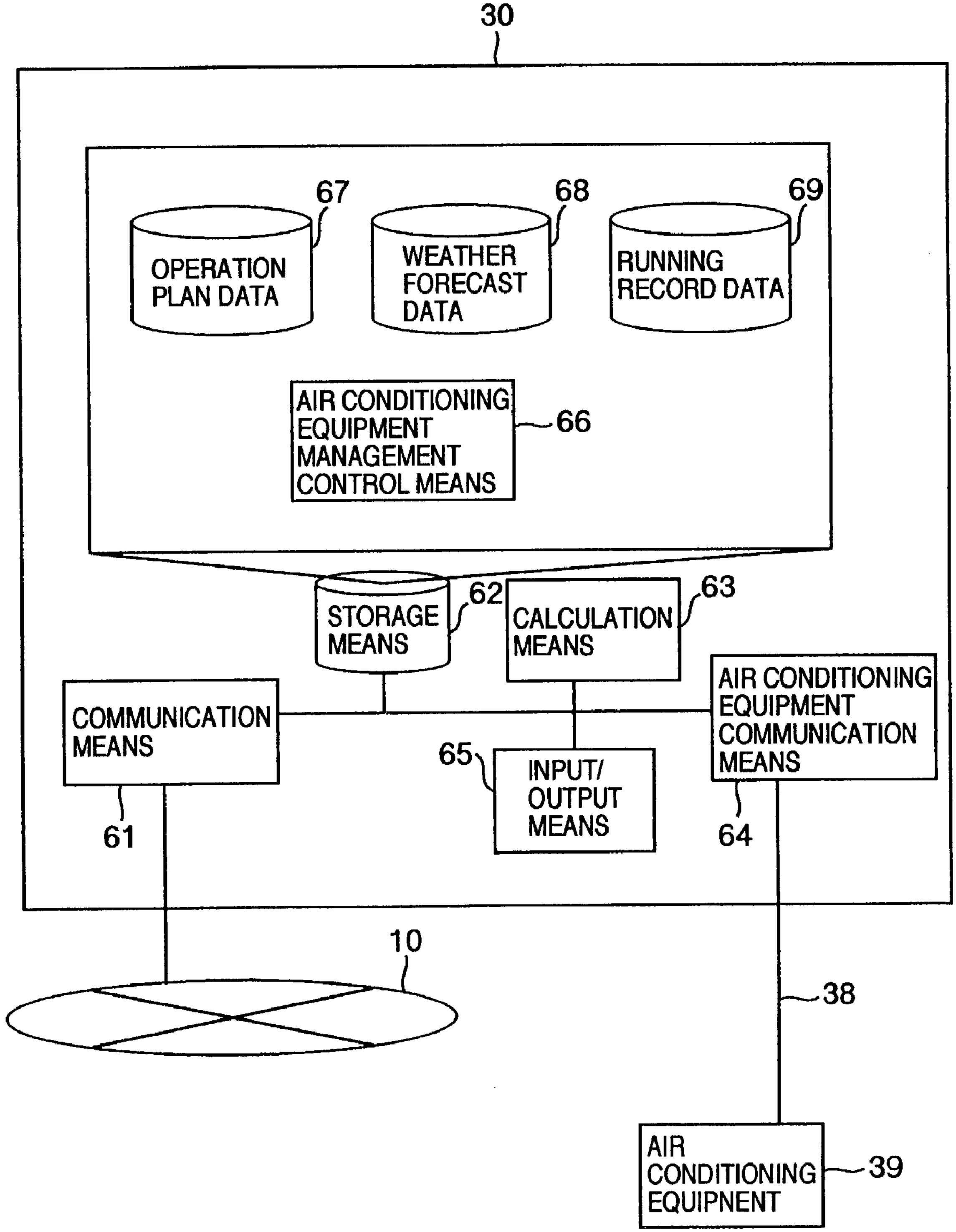
FIG. 2 is a block diagram showing an air conditioning equipment management controller used in the air conditioning equipment operation system of FIG. 1.

FIG. 2 shows in detail the air conditioning equipment management controller 30 of FIG. 1. The air conditioning equipment management controller 30 has hardware including communication means 61 for controlling communications through the network 10, input/output means 65, e.g., a display, a keyboard and a mouse, storage means 62 such as a hard disk, calculation means 63 including a microcomputer, and air conditioning equipment communication means 64 for controlling communications with the air conditioning equipment 39. Air conditioning equipment management control means 66 for operating the air conditioning equipment is software.

The storage means 62 stores running record data 69, and weather forecast data 68 and running plan data 67 transmitted from the control server 20 of the service provider company 2. The air conditioning equipment communication means 64 of the air conditioning equipment management controller 30 transmits/receives data of each device provided in the air conditioning equipment 39 through the air conditioning equipment communication line 38.

The air conditioning equipment management controller 66 manages and controls the air conditioning equipment 39. The air conditioning equipment 39 is controlled by referring to the running plan data 67 transmitted from the control server 20 of the service provider company 2 and stored in the storage means 62. Also, a measurement value measured by a measuring device and a running value of each device are stored as the running record data 68 in the storage means 62. The air conditioning equipment management control means 66 receives the running plan data and the weather forecast data transmitted from the control server 20, and transmits the running record data to the control server.

A manager of the contract site 1 operates the input/output means 65 to check a running state of the air conditioning equipment 39 or the measurement value of the measuring device, and accesses information regarding the fuel/power rate database 21, the device information database 24, the system configuration database 22, and the running record database 25 of the control server. In addition, the operation control means 41, the air conditioning equipment simulator 42, the device characteristic correction means 43, the operation method optimizing means 44, and the equipment designing support means 45 of the control server are used.

Figure 3:
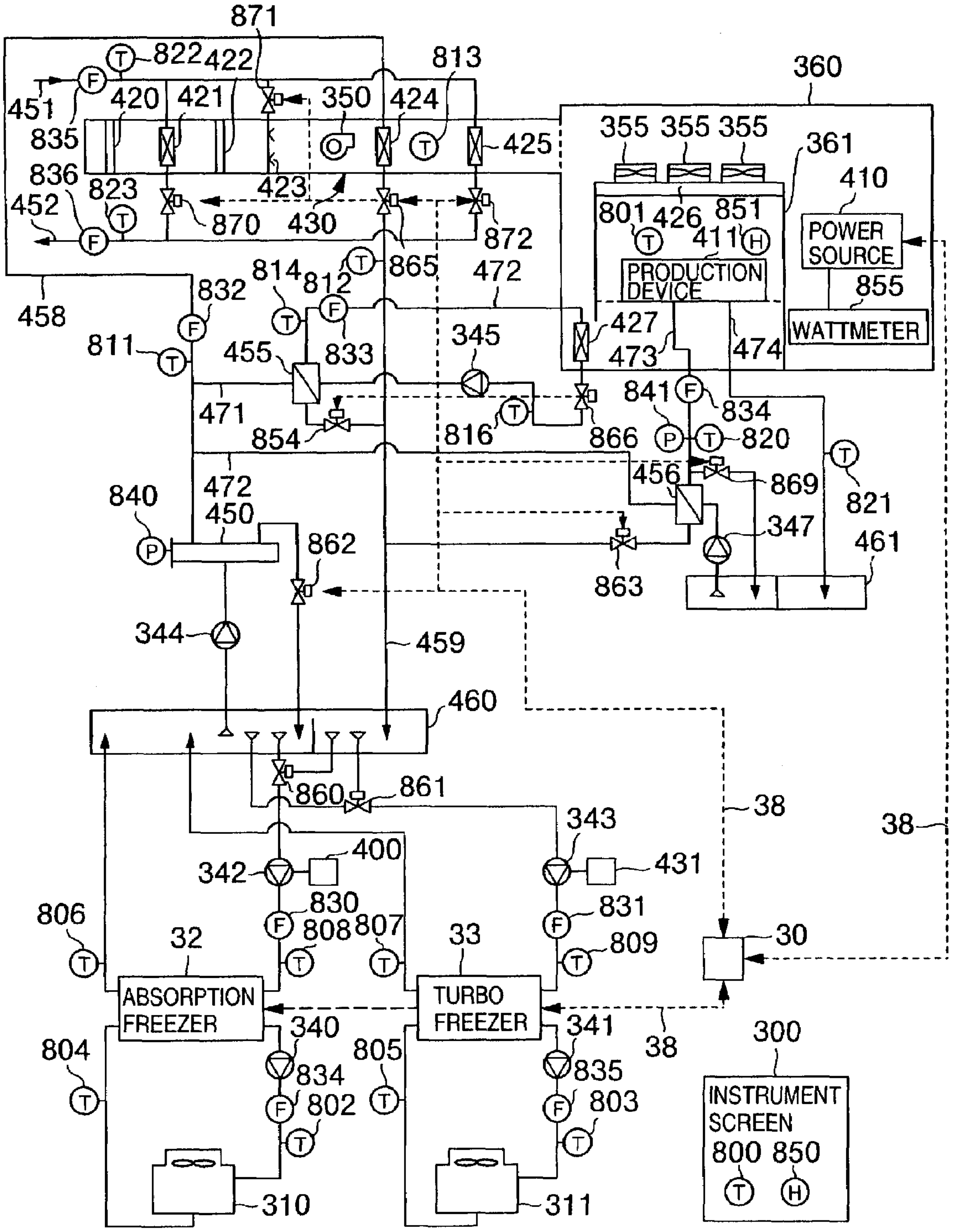
FIG. 3 is a system flowchart of air conditioning equipment used the air conditioning equipment operation system of FIG. 1.

FIG. 3 shows an example of the air conditioning equipment 39 of the contract site 1. The air conditioning equipment 39 includes the absorption and turbo freezers 32 and 33. These freezers 32 and 33 cool cold water, and the cooling load is cooled by the cooled cold water. The cold water is stored in a cold water tank 460.

Now, a device for producing this cold water is described by referring to FIG. 3. Cooling water of the absorption freezer 32 is guided to a cooling tower 310 by a cooling water pump 340, and cooled. Similarly, cooling water of the turbo freezer 33 is guided to a cooling tower 311 by a cooling water pump 341, and cooled. A cold water primary pump 342 driven by an inverter 400 guides the cold water from the cold water tank 460 to the absorption freezer 32. Similarly, a cold water primary pump 343 driven by an inverter 431 guides the cold water from the cold water tank 460 to the turbo freezer 33. Instead of changing a load rate by using the inverters 400 and 431, three-way valves 860 and 861 may be respectively provided in the absorption and turbo freezers 32 and 33 and, by controlling these three-way valves 860 and 861, load rates of the respective freezers may be changed. A detail will be described later.

In the absorption freezer 32, its not-shown controller controls the absorption freezer 32 such that a value detected by a cold water outlet temperature sensor 806 can be equal to a preset target temperature. Similarly, in the turbo freezer 33, its not-shown controller controls the turbo freezer 33 such that a value detected by a cold water outlet temperature sensor 807 can be equal to a target temperature. In the air conditioning equipment of the embodiment, a target temperature is set to 7° C. The target temperature can be changed by a command from the air conditioning equipment management controller 30.

The following elements are attached to the absorption freezer 32: a temperature sensor 808 for detecting a cold water inlet temperature; the temperature sensor 806 for detecting a cold water outlet temperature; a flow meter 830 for detecting a cold water flow rate; a temperature sensor 804 for detecting a cooling water inlet temperature; a temperature sensor 802 for detecting a cooling water outlet temperature; and a flow meter 834 for detecting a cooling water flow rate. The following elements are attached to the turbo freezer: a temperature sensor 809 for detecting a cold water inlet temperature; the temperature sensor 807 for detecting a cold water outlet temperature; a flow meter 831 for detecting a cold water flow rate; a temperature sensor 805 for detecting a cooling water inlet temperature; a temperature sensor 803 for detecting a cooling water outlet temperature; and a flow meter 835 for detecting a cooling water flow rate. Outputs of the temperature sensors 802 to 809 and the flow meters 830 and 831 are used for calculating an amount of cooled heat of the absorption and turbo freezers 32 and 33.

An amount of heat Q32 (kW) for cooling of the absorption freezer 32 is calculated by the following equation (1):

$$Q32=cp\times\rho\times W830/60\times(T808-T806) \tag{1}$$

In the equation (1), Q32 denotes a cooled heat amount (kW) of the absorption freezer 32; cp specified heat at constant pressure for water (kl/kg° C.); ρ a water density (kg/m3); W830 a measurement value (m3/mon.) of the flow meter 830; T806 a measurement value (° C.) of a thermometer 806; and T808 a measurement value (° C.) of a thermometer T808.

In the pumps 340 to 343 for circulating cold water and cooling water, since there is a fixed relation between a flow rate and a current, a flow rate may be calculated by connecting am ammeter to the cold water primary pump 342, and using a value measured by this ammeter, a current of the pump and device characteristic data of the pump. If a flow rate is obtained by using the current of the pump and the device characteristic data of the pump, costs can be reduced because the ammeter is more inexpensive than the flow meter. However, accuracy is lower compared with the flow meter. A cooled heat amount of the turbo freezer 33 can be calculated by a similar method.

Amounts of heat cooled by the respective cooling towers 310 and 311 are calculated from temperatures and flow rates detected by the temperature sensors 802 to 805, and the flow meters 834 and 835. Data on measurements by these sensors are also used for analyzing device characteristics, and by the device characteristic correction means 43.

Next, description is made of an example of a configuration of a cooling load side as a cold water secondary side. The cold water produced by the absorption and turbo freezers 32 and 33 and stored in the cold water tank 460 is sent to a cold water header 450 by a cold water secondary pump 344. Then, a part thereof is supplied to a cold water coil 424 provided in an outside air conditioner 430. A pressure sensor 840 is attached to the cold water header 450. A pipe for returning cold water to the cold water tank is connected to the cold water header 450, and an automatic valve 862 is attached to this pipe. The automatic valve 862 is controlled such that a pressure detected by the pressure sensor 840 can be equal to a preset pressure.

The outside air conditioner 430 is an air passage formed in a rectangular duct shape and, from a left end part of FIG. 3, outside air is captured in this duct by a blower 350. Dust of the outside air captured by the blower 350 is removed by filters 420 and 422. A preheating coil 421 is disposed between the filters 420 and 422; and in the downstream side of the filter 422, a humidifier 423, the blower 350, a cooling coil 424, and a reheating coil 425 in this order. A temperature sensor 813 is disposed in the vicinity of the cooling coil 424. The outside air captured in the outside air conditioner 430 is adjusted for its temperature and humidity to a target temperature and target humidity by the preheating coil 421, the humidifier 423, the cooling coil 424 and the reheating coil 425. The outer air adjusted for its temperature and humidity is guided to a clean room 360.

The cold water guided to the cooling coil 424 of the outside air conditioner 430 is returned through the automatic valve 865 to the cold water tank 460. The automatic valve 865 is controlled such that a temperature detected by the temperature sensor 813 can be equal to a set temperature. To detect a temperature and a flow rate of the cold water supplied to the cooling coil 424, a temperature sensor 811 and a flow meter 813 are provided in a cold water supply pipe 458 and, to detect a return temperature, a temperature sensor 812 is provided in a return pipe 459.

To heat the outside air captured into the outside air conditioner 430, steam is supplied from a not-shown boiler through a pipe 451 to the preheating coil 421, the humidifier 423 and the reheating coil 425. To control the amount of steam supplied to such a device based on the temperature and humidity of the outside air captured into the outside air conditioner 430, detected by a not-shown sensor, an automatic valve 870 is attached to a downstream side of the preheating coil 421; an automatic valve 871 to an upstream side of the humidifier 423; and an automatic valve 872 to a downstream side of the reheating coil 425.

Water having its temperature lowered by heat exchanging of each device, and steam condensed, is returned through a pipe 452 to the boiler. A flow meter 835 and a temperature sensor 822 are attached to the steam supply pipe 451; and a flow meter 836 and a temperature sensor 823 to the condensed water return pipe 452.

A part of the cold water supplied to the cold water header 450 is used for cooling air in the clean room 360. A heat exchanger 455 for dry coil cooling water is attached to a cold water pipe 471 branched from the cold water pipe 458. The outside air distributed in the clean room 360 is heat-exchanged with cooling water circulated in a cooling water pipe 472 by a dry coil 427. This cooling water is heat-exchanged with cold water distributed in the cold water pipe 471 by the heat exchanger 455 for the dry coil cooling water.

The amount of cooling water distributed in the dry coil 427 by a dry coil cooling water pump 345 is adjusted by an automatic flow rate adjusting valve 866 such that values detected by a temperature sensor 814 in a dry coil inlet side, a flow meter of the dry coil 427, and a temperature sensor 816 in a dry coil outlet side can be equal to preset values. The cold water increased in temperature by the heat exchanger 455 for dry coil cooling water is returned from a cold water pipe 459 to the cold water tank 460. An automatic flow rate adjusting valve 964 provided between the heat exchanger 455 for dry coil cooling water and the cold water pipe 459 is controlled such that a temperature detected by the temperature sensor 814 can be set equal to a preset temperature.

Another part of the cold water supplied to the cold water head 450 is passed through the pipe 472 branched from the pipe 458, and used for cooling a production device 411 installed in the clean room 360. The cold water distributed through the pipe 472 is heat-exchanged with cooling water for cooling the production device 411 by a heat exchanger 456 for production device cooling water. The cold water increased in temperature by the heat-exchanging with the cooling water is returned from the cold water pipe 459 to the cold water tank 460. An automatic flow rate adjusting valve 863 is provided between the heat exchanger 456 for production device cooling water and the cold water pipe 459, and adapted to adjust the amount of cold water distributed in the pipe 459.

The cooling water for cooling the production device 411 is supplied from a production device cooling water tank 461 to the heat exchanger for device cooling water by a device cooling water pump 347, heat-exchanged with the cold water, and then supplied through a cooling water pipe 473 to the production device 411. The cooling water having cooled the production device 411 is returned through a cooling water pipe 474 to the production device cooling water tank 461. The following elements are attached to the cooling water pipe 473: a temperature sensor 820 for detecting a cooling water inlet temperature; a pressure sensor 841 for detecting an inlet pressure; and a flow meter 834 for detecting the amount of cooling water. A temperature sensor 821 for detecting a cooling water outlet temperature is attached to the cooling water pipe 474. A pipe is provided, which is branched from the cooling water pipe 473 to return the cooling water to the production device cooling water tank 411, and an automatic valve 869 is attached to this pipe. This automatic valve 869 is controlled such that a pressure detected by the pressure sensor 841 can be equal to a preset pressure.

The outside air captured into the clean room 360 is guided to a filter 426 by fan units 355, 355, . . . , supplied to a partition room 361 disposed in the production device 411 after its dust is removed, forming a down-flow in the partition room 361. Subsequently, the outside air is passed from a floor surface having a grating to the outside of the partition room 361, and heat-exchanged with the cooling water by the dry coil 427 to be cooled. A temperature sensor 801 for measuring a temperature in the partition room 361, and a hygrometer 851 for measuring humidity are respectively provided in proper positions in the partition room 361.

An exchanged heat amount of the cooling coil 424 provided in the outside air conditioner 430 is calculated from detected values of two temperature sensors 811 and 812 and a flow meter 832 provided in the cold water pipe 458. An exchanged heat amount of the dry coil 427 is calculated from detected values of temperature sensors 814 and 816 and a flow meter 833 provided in the cooling water pipe of the dry coil 427. A heat amount for cooling of the production device 411 is calculated from detected values of temperature sensors 820 and 821 and a flow meter 834 provided in the cooling water pipes 473 and 474 of the production device 411. By totaling the above amounts of heat, a cooling load of the entire clean room 360 is obtained.

A mass flow rate of steam distributed in the pipe 451 of the outside air conditioner 430 is calculated from detected values of the temperature sensor 822 and the flow meter 835. Then, a mass flow rate of water distributed in the pipe 452 of the outside air conditioner 430 is calculated from detected values of the temperature sensor 823 and the flow meter 836. By subtracting the mass flow rate of water distributed in the pipe 452 from the mass flow rate of steam distributed in the pipe 451, an amount of steam to be used by the hygrometer 423 provided in the outside air conditioner 430 is obtained.

From detected values of the temperature sensors 822 and 823 and the flow meter 836 attached to the pipes 451 and 452 of the outside air conditioner 430, a specific enthalpy of the steam distributed in the pipe 451, a specific enthalpy of the water distributed in the pipe 452, and a mass flow rate are calculated. By using these values, a total amount of heat exchanged between the preheating coil 421 and the reheating coil 425 of the outside air conditioner 430 is represented by the following equation (2):

$$(Q421+Q425)=G452\times(h451-h452) \quad (2)$$

In the equation (2), Q421 denotes an amount of exchanged heat (kW) of, the preheating coil 421; Q425 an amount of exchanged heat (kW) of the reheating coil 425; G452 a mass flow rate (kg/s) of the water in the pipe 452; h451 a specific entropy (kj/kg) of the steam in the pipe 451; and h452 a specific entropy (kJ/kg) of the water in the pipe 452.

The clean room 360 includes a power source 410 for the production device 411, consumption of power is measured by a wattmeter 855. Heat generated by a device such as the production device 411 becomes a cooling load of air in the clean room or device cooling water. As most of the power consumed becomes heat, the consumption of power measured by the wattmeter 855 is used for cooling load analysis. To measure a temperature and humidity of the outside air, a thermometer 800 and a hygrometer 850 are provided in an instrument screen 300.

The absorption and turbo freezers 32 and 33, their respective accompanying cooling towers 310 and 311, the following elements provided in the air conditioning equipment operation system, i.e., the pumps 340 to 347, the valves 860 to 872, the temperature sensors 800 to 825, the hygrometers 850 and 851, the flow meters 830 to 836, and the pressure sensors 840 and 841, are connected to the air conditioning equipment management controller 30, or connected with one another by using the air conditioning equipment communication line 38. By using the air conditioning equipment communication line 38, running of each device of the air conditioning equipment is started/stopped, and a control target value is changed. Moreover, a detected value of each sensor such as the temperature sensor, the pressure sensor or the flow meter, and a running signal or a stop signal of each device are transmitted.

Figure 4:
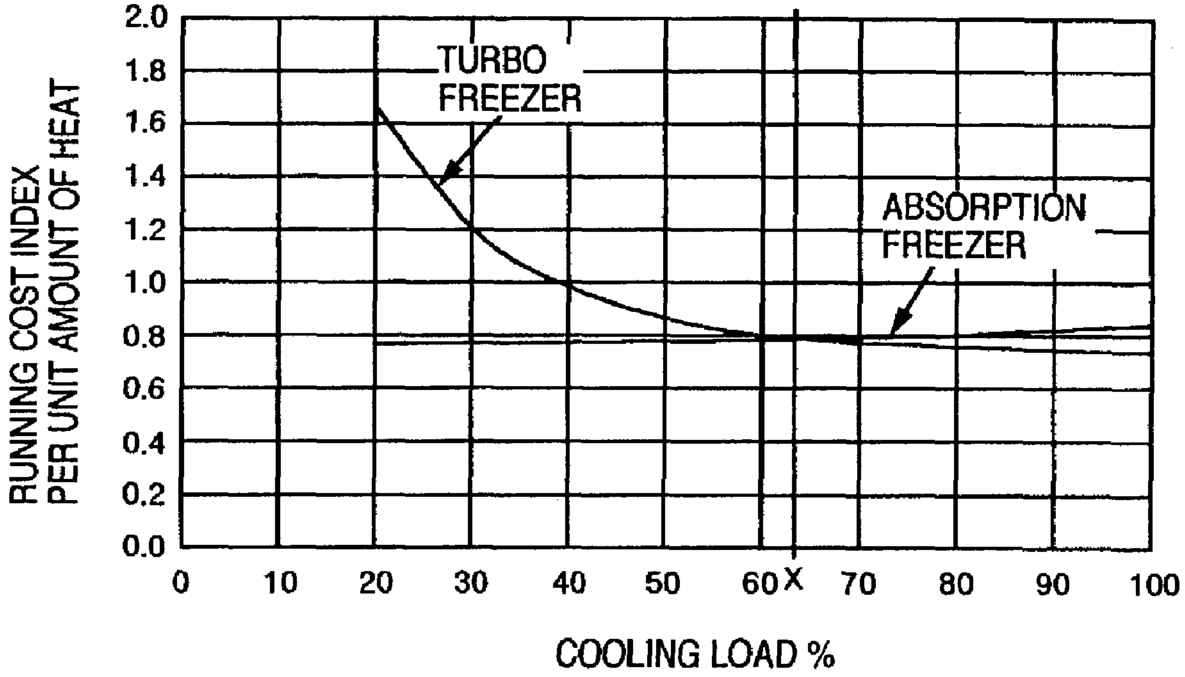
FIG. 4 is a view illustrating running costs of a freezer.

Next, description is made of a method of operating the absorption and turbo freezers 32 and 33 in combination. FIG. 4 shows a calculation example of a running cost index per a unit amount of cooled heat for a cooling load in each of the absorption and turbo freezers 32 and 33. A value shown can be calculated by referring to the partial load characteristic data of each of the absorption and turbo freezes 32 and 33 stored in the device information database 24, and the gas rate and power rate data stored in the fuel/power rate database 21.

A value at 100% of a cooling load is when each of the absorption and turbo freezers 32 and 33 is run by maximum cooling capability. Hereinafter, % indication represents a ratio of the freezer to the maximum cooling capability. In the case of the turbo freezer 33, efficiency is high if it is operated at a maximum cooling capability point, and the efficiency is lowered as the amount of cooled heat is reduced. On the other hand, in the case of the absorption freezer 32, a change in efficiency is only slightly increased even when the amount of heat is reduced. In FIG. 4, a ratio of coefficients of performance (COP) between the absorption and turbo freezers 32 and 33 during cooling is set to 1:4.7, and a ratio of unit prices between gas and power is set to 1:4.2.

Figure 5:
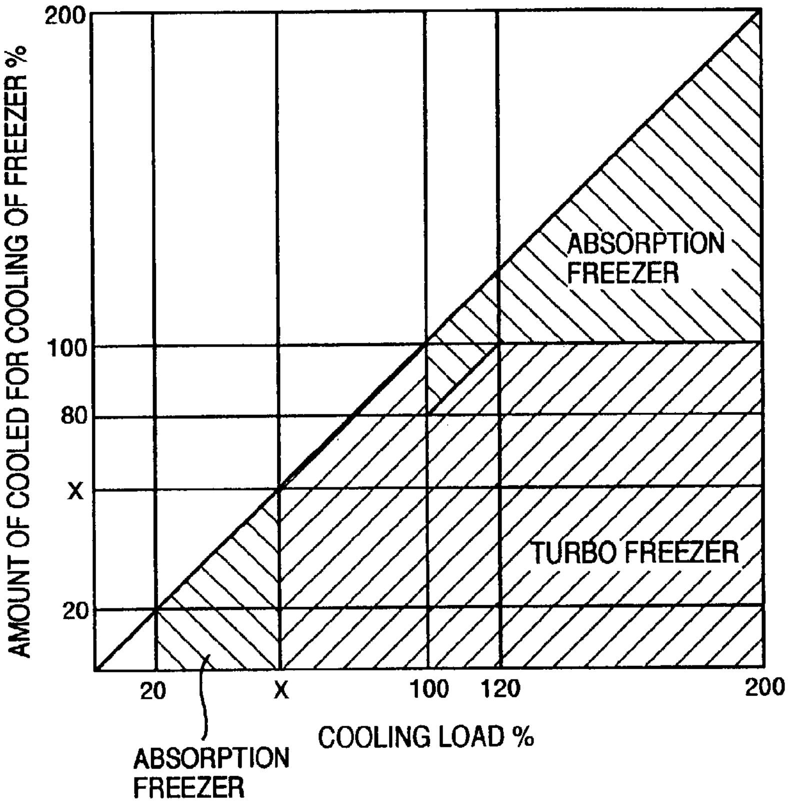
FIG. 5 is a view illustrating an operation pattern of the freezer.

In FIG. 4, characteristics of the absorption and turbo freezers intersect each other at the amount of cooled heat X. Running costs are lower if the turbo freezer 33 is used when a cooling load is X or higher, and if the abruption freezer 32 is used when a cooling load is X or lower. FIG. 5 shows an example of operating the absorption and turbo freezers 32 and 33 in combination. Maximum cooling capabilities of the absorption and turbo freezers 32 and 33 are similarly set to 100%.

As running costs are lower if the absorption freezer 32 is used up to X % of a cooling load, the absorption freezer 32 is run. When a cooling load is X % or higher and within a range of 100% or lower, running costs are lower if the turbo freezer 33 is used. Thus, the turbo freezer 33 is run. When a cooling load exceeds 100% and reaches 120% or lower, 20% of the cooling load is cooled by the absorption freezer, and a remaining part of the cooling load is cooled by the turbo freezer. When a cooling load is 120% or higher, 100% of the cooling load is cooled by the turbo freezer, and a remaining part of the cooling load is cooled by the absorption freezer.

Figure 6:
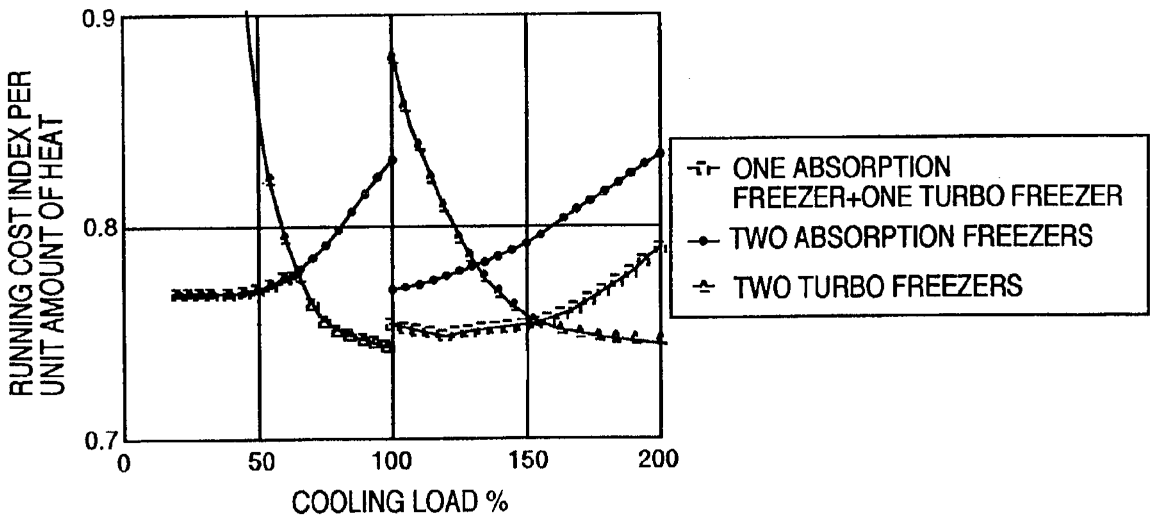
FIG. 6 is a view illustrating running costs of the freezer.

FIG. 6 shows an example of a change in a running cost index per a unit amount of cooled heat when there are two turbo freezers and two absorption freezers, in a case where one turbo freezer and one absorption freezer are run in combination. It is assumed that when the two turbo freezers and the two absorption freezers are used, one freezer is run if a cooling load is 100% or lower, and two freezers are run if a cooling load is larger than 100%; and maximum amounts of cooled heat for the two freezers are equal to each other.

At about 155% or higher of a cooling load, running costs are smallest if the two turbo freezers are used. In the range of a cooling load other than this, running costs become smallest by using one each of the absorption and turbo freezers, and running the freezers according to the operation method of FIG. 5.

The maximum cooling capability of the freezer is set somewhat enough to spare even in summer when a cooling load is large. A ratio of time for running the freezer in a load zone of summer season when a cooling load is largest is small in running time throughout four seasons. In other words, running time is short at near 200% of a cooling load.

Figure 7:
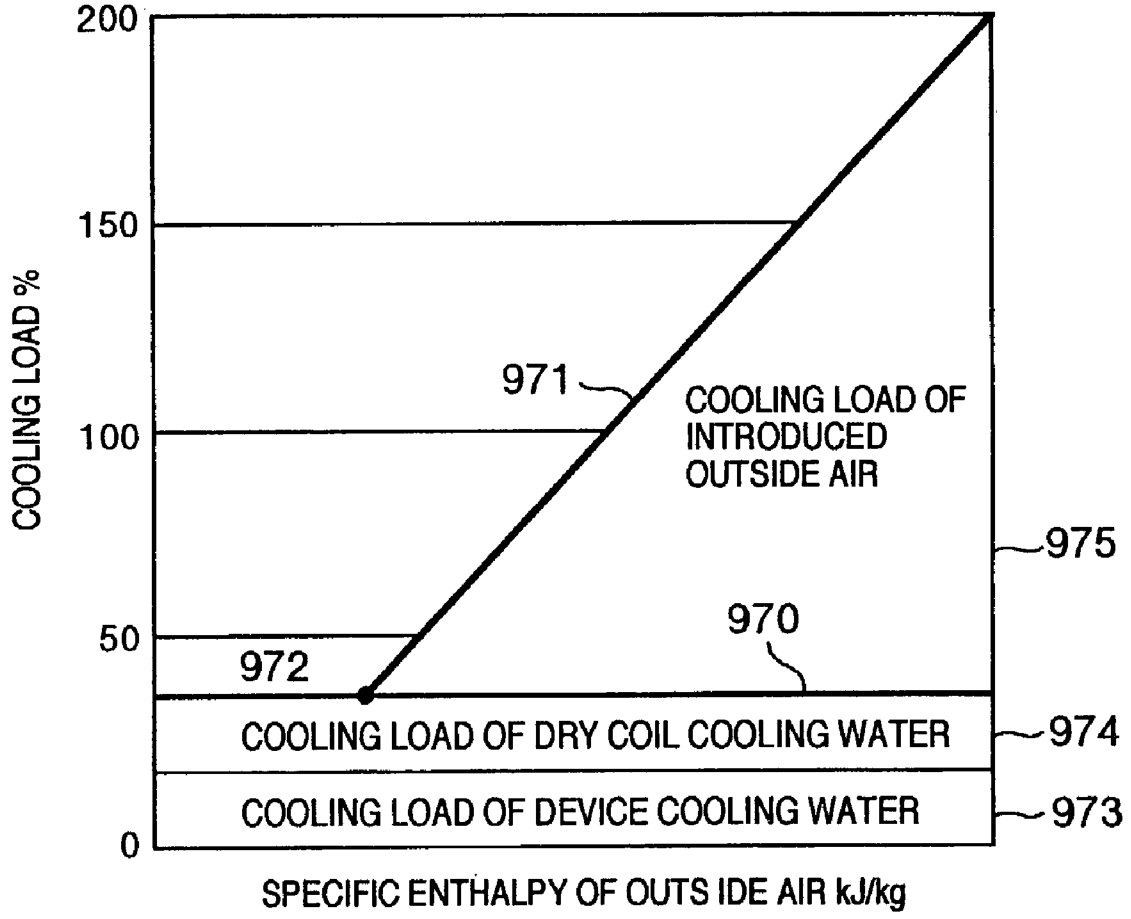
FIG. 7 is a view illustrating a cooling load of a clean room.

FIG. 7 shows a change in a cooling load with respect to a specific enthalpy of an outside air in the clean room. A line 970 indicates a total amount of heat generated from the production device 411, the fan unit 355, illumination, a worker and the like in the clean room 360. The heat generated in the clean room 360 is carried away by cooling water distributed through the dry coil 427 and cooling water for cooling the production device. The amount of this heat is represented as a load 974 of the dry coil 427 and a cooling load 973 of the production device. A line 971 indicates a total amount of the heat generated in the clean room and a cooling load of the outside air. Inclination of the line 971 is equivalent to a mass flow rate (kg/s) of introduced outside air. At a point 972, a cooling load of outside air absorbed from the outside air conditioner 430 is eliminated.

Figure 8:
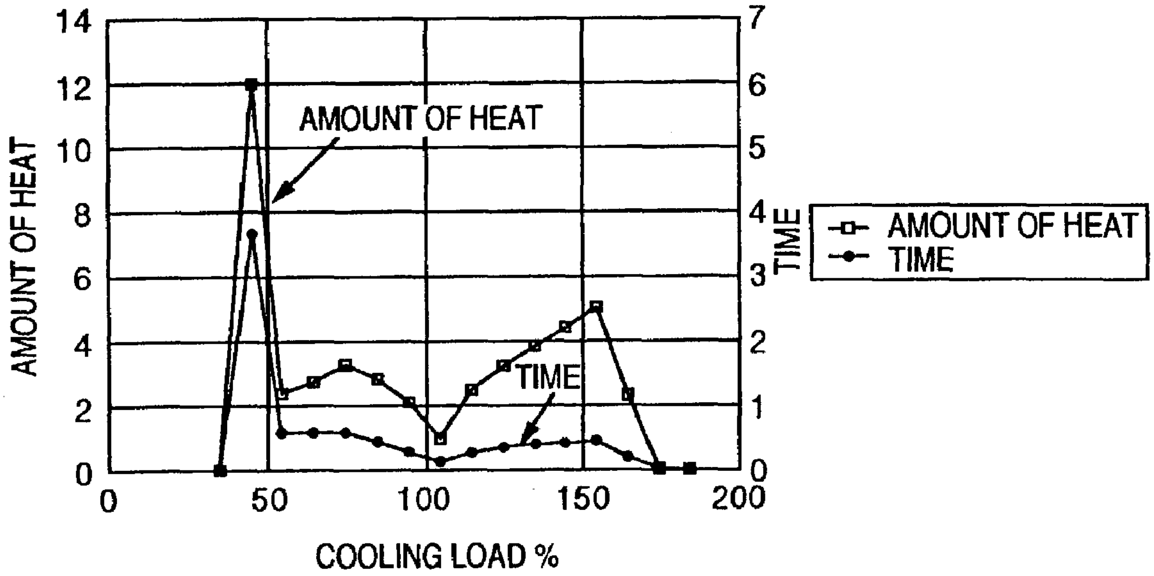
FIG. 8 is a view illustrating a cooling load of the air conditioning equipment.

FIG. 8 shows an example of a distribution of a cooling load. Use of air conditioning equipment having the cooling load characteristic shown in FIG. 7 is assumed. Regarding a outside air condition, a condition of one region in Japan is assumed. For each ratio of a cooling load to the maximum cooling capability of the freezer, an accumulated time of an operation by the load, and an accumulated amount of heat are shown.

Figure 9:
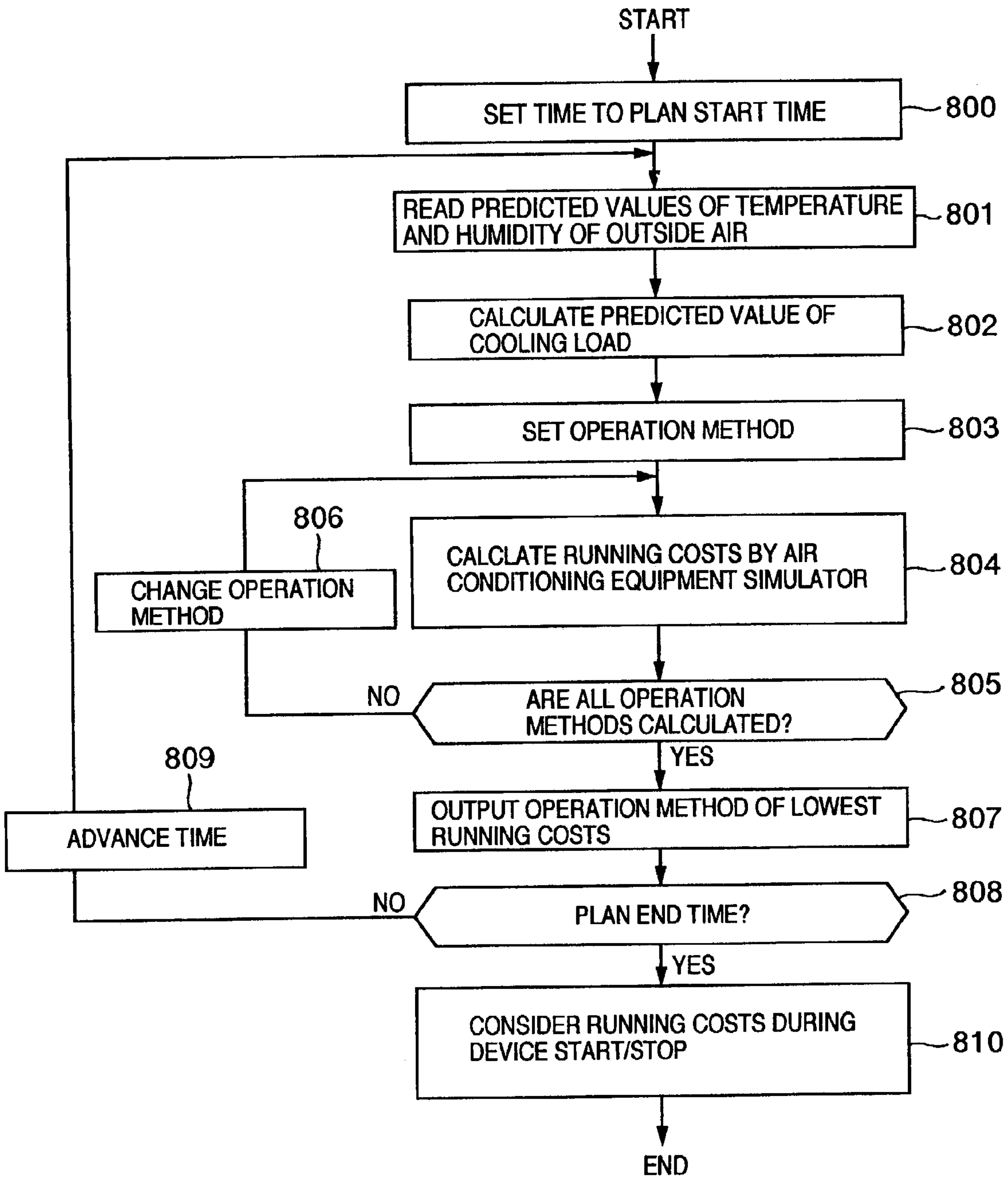
FIG. 9 is a flowchart for operating the air conditioning equipment.

Now, description is made of a method for reducing costs of the air conditioning equipment operation system under the foregoing condition and characteristic. FIG. 9 shows a method for reducing gas and power rates by using the operation method optimizing means 44. Gas and power rates fluctuate due to seasonal or external factors. When a temperature or humidity of an outside air is changed even if a cooling load is maintained constant, changes occur in the amounts of cooled heat of the cooling towers 310 and 311 of the freezers. Consequently, a cooling water temperature is changed to cause changes in running costs of the absorption and turbo freezers 32 and 33.

Now, the air conditioning equipment 39 shown in FIG. 3 is taken as an example. The operation method optimizing means 44 sets time to zero hour as a plan start time (step 800S). Then, predicted values of a temperature and humidity of outside air are read (step 801S). For the predicted values of the temperature and humidity of the outside air, forecast values of the weather forecast company 8 are used. If operation time is different from the predicted time of the weather forecast company 8, a predicted value of operation time is obtained by interpolating data sent from the weather forecast company.

A predicted value of a cooling load is calculated (step 802S). A predicted value of a specific enthalpy of the outside air is calculated based on the predicted values of the temperature and humidity thereof. After the specific enthalpy is obtained, a cooling load is calculated based on the relation between the specific enthalpy and the cooling load of the outside air shown in FIG. 7. The relation between the specific enthalpy and the cooling load of the outside air shown in FIG. 7 is prepared beforehand by a later-described method based on the running record data stored in the running record database 25.

Then, an operation method is set (step 803S). It is assumed that air conditioning equipment has a characteristic similar to that shown in FIG. 5, and a predicted value X of a cooling load is 150%. In this case, since a shortage of cooling capability occurs if only one freezer is used, two freezers are necessary. If X1 denotes a target amount of cooled heat of the absorption freezer 32, and X2 a target amount of cooled heat of the turbo freezer 33, there are following three possible combinations. Such combinations are stored beforehand in the database.

(1) X2=100, X1=X−X2
(2) X1=100, X2=X−X2
(3) X1=X/2, X2=X/2

Running costs when the operation method (1) is used are calculated by using the air conditioning operation simulator (step 804S). As the calculated running cots are used again in step 810S, the running costs are stored in the storage means. This process is executed for all the three operation methods. After all the operation methods (1) to (3) are calculated, the calculation is stopped, and the process proceeds to step 807S (step 805S). If there are any cases remaining to be calculated, the process proceeds to step 806S, where other operation methods are calculated. Results of the calculated three running costs are compared with one another, a most inexpensive operation method is selected, and this operation method is outputted (step 807S).

A candidate operation method of the freezer obtained for each cooling load is as follows:

In the case of X≦100,
(A) X1=X, X2=0
(B) X1=0, X2=X

In the case of 100<X≦120,
(C) X1=20, X2=X−X1
(D) X2=20, X1=X−X2
(E) X1=X/2, X2=X/2

In the case of 120<X≦200,
(F) X2=100, X1=X−X2
(G) X1=100, X2=X−X1
(H) X1=X/2, X2=X/2

Then, determination is made as to whether time is an operation end time or not (step 808S). If the time is not the operation end time, the time is advanced by predetermined time (step 809S). By setting a time interval to be 10 min., the time is advanced by 10 min. This operation is repeated, and an operation plan of one day described for each 10 min., is made. After the operation plan of one day is made, consideration is given to running cots at the time of starting/stopping the device operation (step 810S).

After the operation of the freezer is started by setting an operation method, if an operation method is changed during the same day, running costs occur following the start/stop of the device running. Thus, comparison is made in running costs between the case of changing an operation method and the case of not changing an operation method in a day, and an operation method of lowest running costs is selected. For example, a plan is made in a manner that the turbo freezer is run until 24:00 of a day before a planning day, the turbo freezer is run from 0:00 to 12:00 of the planning day, the absorption freezer is run from 12:00 to 15:00, and the turbo freezer is run from 15:00 to 24:00. In this case, operation methods (4) to (6) described below are compared with one another, and one having lowest running costs is selected.

(4) The turbo freezer is run from 0:00 to 12:00; the absorption freezer from 12:00 to 15:00; and the turbo freezer from 15:00 to 24:00.
(5) Only the turbo freezer is run continuously from 0:00 to 24:00.
(6) Only the absorption freezer is run continuously from 0:00 to 24:00.

Since the calculation result of the running costs was stored in step 804S of FIG. 9, it is not necessary to calculate running costs. Since the turbo freezer is run on a previous day, in the operation method (6) switching to the absorption freezer, or the operation method (4) switching the operated freezer to another in the midway, running costs occur following the operation start/stop of the device. These costs are added. By the operation in step 810S, the inconvenience of operation switching in a short time can be removed.

The operation plan made by the operation method optimizing means 44 is sent as operation plan data through the network 10 to the air conditioning equipment management controller 30. The operation plan data is composed of "condition" and "operation", e.g., in a form of "if . . . , then . . . ". The air conditioning equipment management controller 30 operates the air conditioning equipment based on this operation plan data. At the time of starting the operation, it takes time for the device to be set in a stationary state. The operation plan data is prepared by considering the time of this transient state. In the case of the absorption freezer, 30 min., or less is necessary to reach a stationary state. Thus, to set the absorption freezer in a stationary state at 12:00, operation plan data for starting operation of the absorption freezer by 11:30 is made.

The "condition" may be time, a physical quantity obtained from a measurement value of a temperature or the like of the outside air, or a detected value of a cooling load or the like, or a combination thereof. If the "condition" is a combination of the physical quantity calculated from the measurement value of the temperature of the outside air of the time for changing the operation or the detected value of the cooling load, with a time range, an advantage is provided because it is not necessary to change the operation plan data even if an actual temperature and humidity are slightly different timewise from predicted values of a temperature and humidity obtained from weather forecast. For example, if it is planned that "operation of the absorption freezer 32 is started at 10:00, and a cooling load is 95% at this time", operation plan data, i.e., "when a cooling load is 95% or higher from 9:00 to 11:00, operation of the absorption freezer is started", is made. Thus, it is possible to deal with a situation where an increase in the temperature of the outside air is somewhat quickened, and a cooling load reaches 95% at 9:30.

If the actual temperature and humidity exceed a permissible range obtained from the weather data predicted by the weather forecast company 8, or if the weather forecast company 9 changes a weather forecast, the operation plan is reviewed. If the actual temperature and humidity are not as predicted, causing a shortage of cooling capability of the freezer, the freezer that has not been operated is run. This setting is prestored in the air conditioning equipment management control means 66 of the air conditioning equipment management controller 30. When this setting is executed, the operation plan is reviewed.

Figure 10:
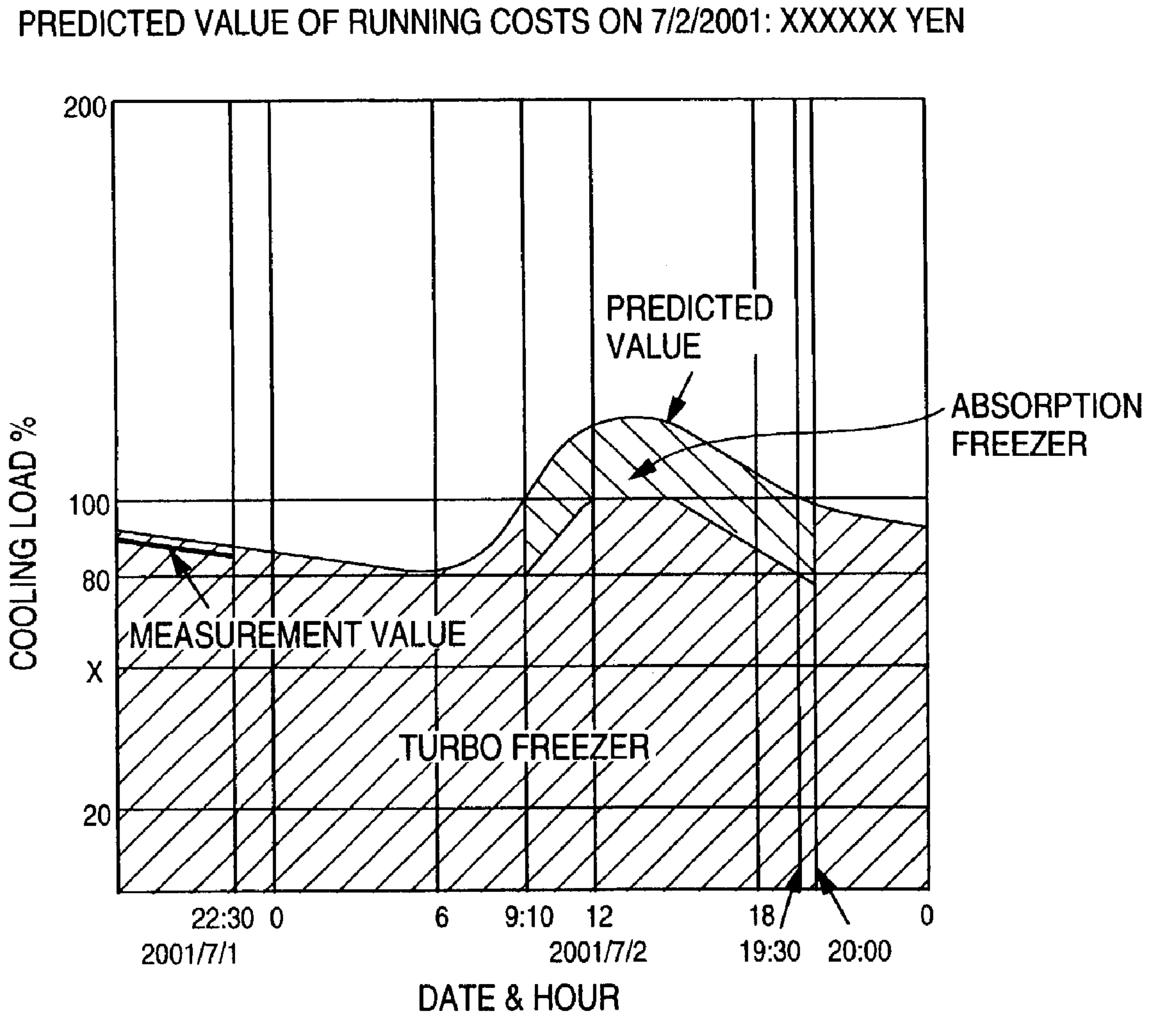
FIG. 10 is a view illustrating a change in the cooling load.
Figure 11:
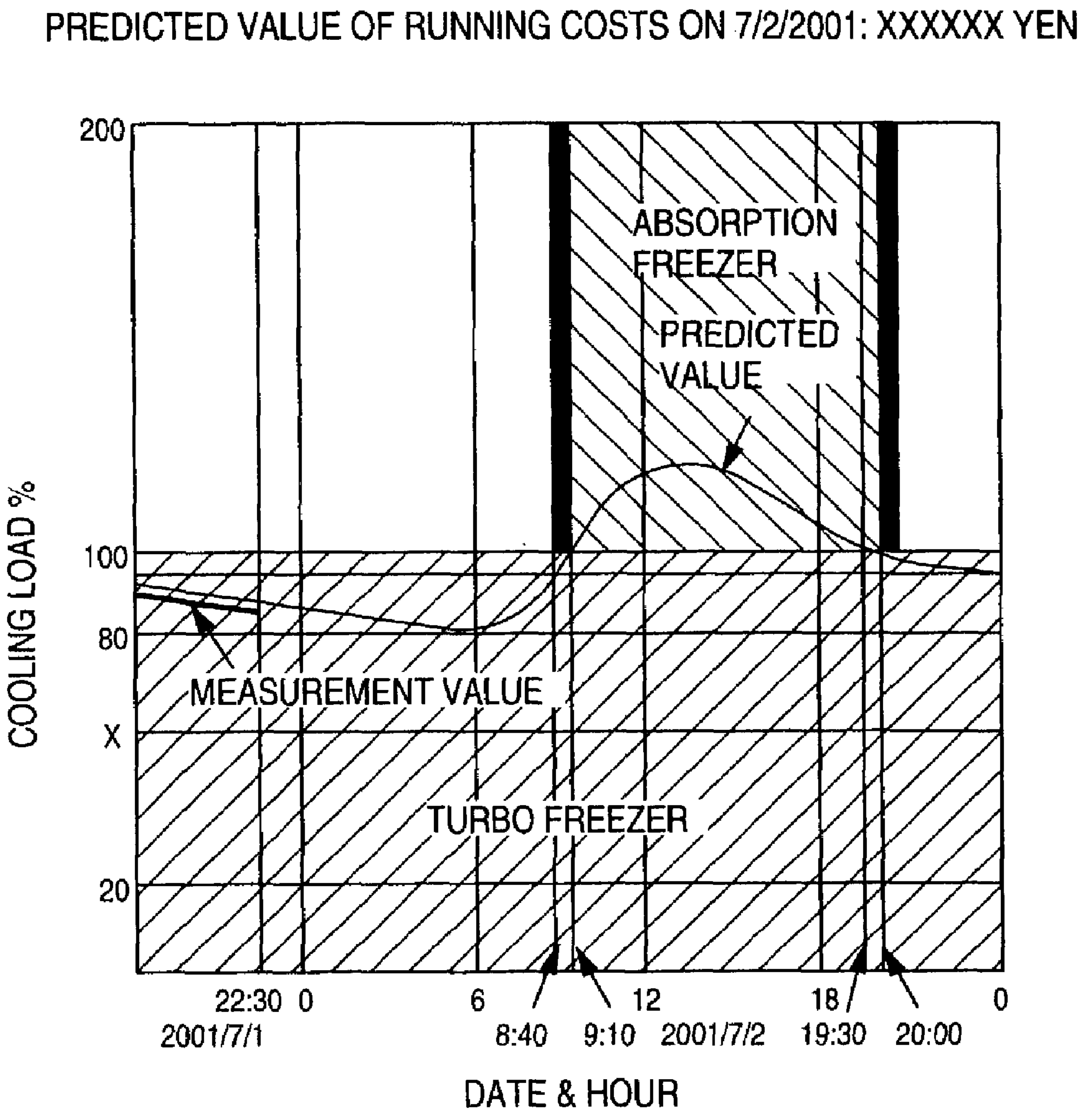
FIG. 11 is a view illustrating another change in the cooling load.

Each of FIGS. 10 and 11 shows an example of an operation plan displayed on a control monitor of an air control monitor of the air conditioning equipment management controller 30. The planning engineer of the service provider company 2 verifies the operation plan and predicted and measurement values of a cooling load by using the input/output means of the control server 20; the manager of the contract site 1 by using input/output means 65 of the air conditioning equipment management controller 30. The predicted and measurement values of the cooling load, a current time and a predicted value of running costs are displayed. In FIG. 10, predicted values of cooled heat amounts of the absorption and turbo freezers 32 and 33 are also displayed. In FIG. 11, maximum values of cooling capabilities of the absorption and turbo freezers 32 and 33 are also displayed.

A current time in the drawing is 22:30 of Jul. 1, 2001 and, from a screen of FIG. 11, it can be seen that a predicted value of a cooling load becomes 100% around 9:10 of July 2, causing a shortage of cooling capability in the case of using only the turbo freezer. As it takes 30 min., or less to reach a stationary state from the operation state of the absorption freezer 32, the absorption freezer 32 may be actuated to compensate for cooling capability at 8:40. Since a cooling load becomes 94% at 8:40, it is planned that the operation of the absorption freezer 32 is started when the cooling load becomes 94%. When the cooling load is 100% or lower continuously for 30 min., the absorption freezer 32 is stopped. A condition where the cooling load is 100% or lower continuously for 30 min., is set in order to prevent repetition of an operation start and stop in a short time.

From a screen of FIG. 10, distributed states of the cooling loads of the absorption and turbo freezers 32 and 33. The cooling loads of the absorption and turbo freezers 32 and 33 are distributed by controlling the three-way valves 860 and 861 in such a way as to set inlet temperatures according to the cooling loads of the respective freezers, the three-valves 860 and 861 having been controlled such that cold water inlet temperatures detected by the temperature sensors 808 and 809 provided in the cold water pipes of the respective freezers can be set equal to the target temperature 7° C. A target value of a cold water inlet temperature of the absorption freezer 32 is obtained by the following equation (3):

$$Tt808=T806+Qt32/(cp\times\rho\times w830) \quad (3)$$

In the equation (3), Qt32 denotes a target amount of cooled heat (kW) of the absorption freezer; cp specified heat at constant pressure of water (kJ/kg° C.); ρ a water density (kg/m3); w830 a measurement value (m3/min.) of the flow meter 830; T806 a measurement value (° C.) of the thermometer 806; and Tt808 a target value (° C.) of a cold water inlet temperature of the absorption freezer 32. For the turbo freezer 33, calculation is similarly carried out.

In the foregoing embodiment, the cooling loads of the turbo and absorption freezers 33 and 32 are distributed by using the three-way valves 860 and 861. However, the cooling loads can also be distributed by setting the cold water primary pumps 342 and 343 as pumps to be driven by the inverters 400 and 431. Now, this method is described. By the inverters 400 and 431, cold water flow rates of the cold water primary pumps 342 and 343 are changed. A ratio of cooled heat amounts between the absorption and turbo freezers 32 and 33 is changed according to a ratio of cold water flow rates between the absorption and turbo freezers 32 and 33. For example, to set a ratio of cooled heat amounts between the absorption and turbo freezers 32 and 33 to 2:10, frequencies of the inverters 400 and 431 are changed in such a way as to set a ratio of cold water flow rates between the cold water primary pumps 342 and 343 to 2:10. Since the use of the inverters 400 and 431 enables proper flow rates to be realized by proper motive power, running costs can be reduced.

Figure 12:
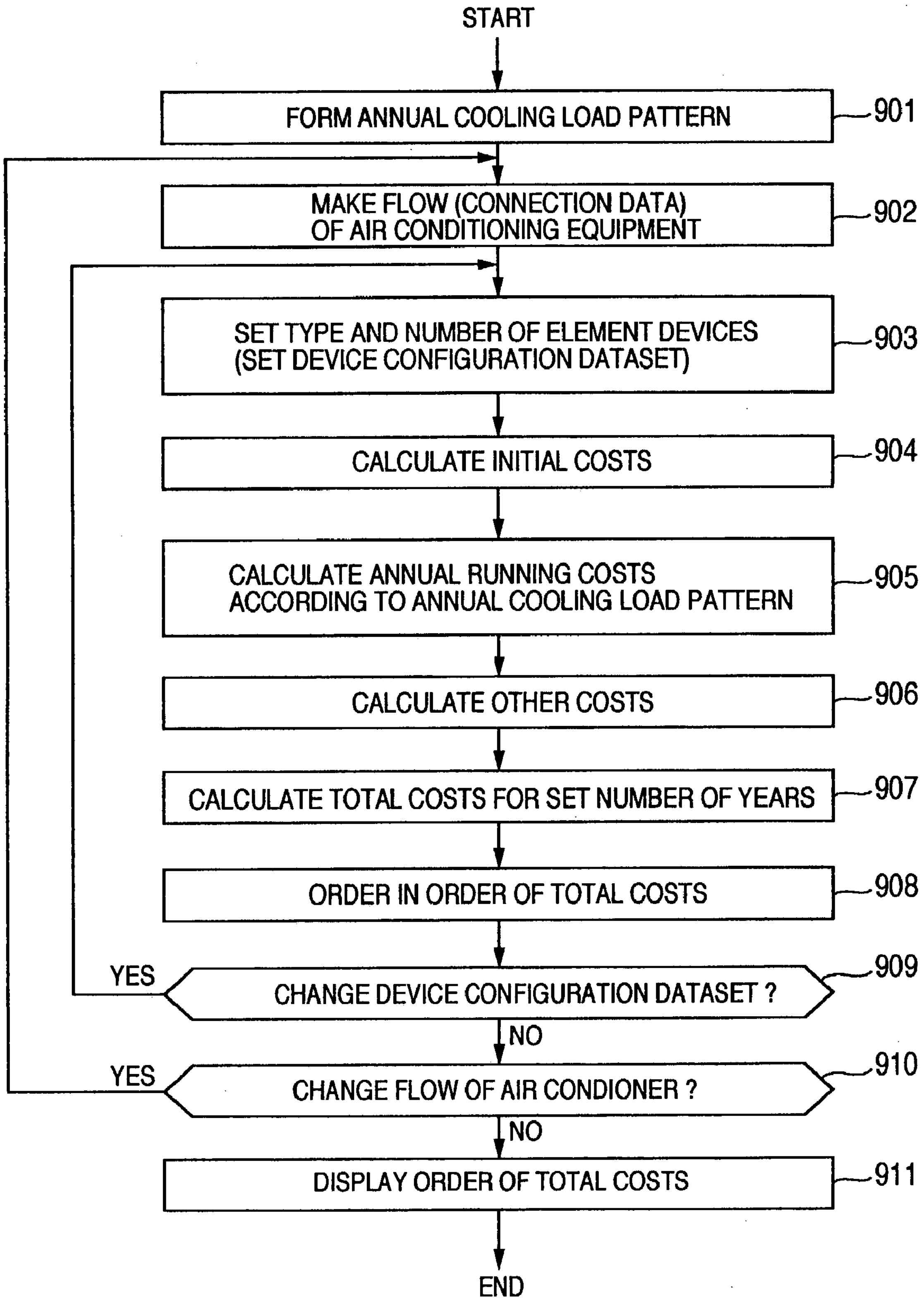
FIG. 12 is a flowchart for optimizing air conditioner designing.

Each of FIGS. 12 and 13 shows optimization of air conditioner designing carried out by using the equipment designing support means 45. By using the annual temperature and humidity fluctuation data stored in the weather database, and the relation of the cooling load to the specific enthalpy of the outside air shown in FIG. 7, an annular cooling load pattern is formed in step 901. In a designing stage, a relation is set between a specific enthalpy of outside air and a cooling load is set as follows.

That is, cooling loads 973 and 974 of dry coil cooling water and production device cooling water are caused by heat generated from the production device 411 in the clean room 360, heat from the fan unit 355, and heat from illumination and the like. Among the amount of heat generated from the production device 411, an amount of heat cooled by the production device cooling water is estimated to be set as the cooling load 974 of the production device cooling water. The amount of heat from the production device 411 in the clean room 360, the amount of heat from the fan unit 355, and the amount of heat from the illumination or the like are estimated. The cooling load 974 of the production device cooling water is subtracted from the total amount thereof to be set as the cooling load 973 of the dry coil cooling water.

In FIG. 7, inclination of a cooling load 975 of the introduced outside air is equivalent to a mass flow rate (kg/s) of the introduced outside air. A specific enthalpy at the point 972 where the lien 971 of the cooling load of the introduced out side air intersects the line 970 of a sum of the cooling loads 974 and 973 of the dry coil cooling water and the device cooling water is set as a specific enthalpy of air to be cooled by the cooling coil 424 of the outside air conditioner 430.

In step 902, a connection relation among the individual devices of the air conditioning equipment 39 is set. A designer enters the following bits of information by using an editor installed in a computer: type information for each device such as the pump, the freezer, or the temperature sensor, physical connection information indicating that cold water discharged from the pump is guided to the freezer, and control information indicating that a detected value of the temperature sensor is set equal to a set temperature as a control target value.

In step 903, a type and the number of device are set. One air conditioning equipment is constructed by referring to the device configuration dataset registered in the device information database 24. FIG. 13 shows an example of such a device configuration dataset. The device configuration dataset includes data on a type of each device, and the number thereof. One to be used for the air conditioning equipment is selected from the devices registered in the device information database 24, and entered to items of the device configuration dataset. If the device to be used is not registered in the device information database 24, this device is newly registered in the device information database 24.

As the price data is also stored in addition to the device characteristic data in the device information database 24, in step 904, initial costs are calculated for each air conditioning equipment by using this price data. Based on the annual cooling load pattern formed in step 901, in step 905, an optimum operation method is decided for each cooling load. Running costs when the air conditioning equipment is operated by this method for one year are calculated. As an example of the optimum operation method, an optimization algorithm of the operation plan shown in FIG. 9 may be cited.

In step 906, calculation is made as to maintenance contract costs, maintenance costs, insurance costs, taxes, costs for disposal, and other costs. In step 907, calculation is made as to a total of running costs, initial costs and other costs when the air conditioning equipment is operated for the number of years decided by contract. In step 908, total costs of the foregoing respective costs are ordered from lowest.

In step 909, determination is made as to whether or not to change the device configuration dataset. If the device configuration dataset is changed, the process returns to step 903. If the device configuration dataset is not changed, the process proceeds to step 910. In step 910, determination is made as to whether or not to change the connection relation (flow) of the air conditioning equipment. If the connection relation of the air conditioning equipment is changed, the process returns to step 902. If not, the process returns to step 911. In step 911, the candidate air conditioning equipment are displayed in the lowest order of the total costs. According to the embodiment, since the calculation of the total costs is repeated by changing the flow of the air conditioning equipment or the device configuration dataset, the air conditioning equipment of low total costs can be easily constructed.

Figure 14:
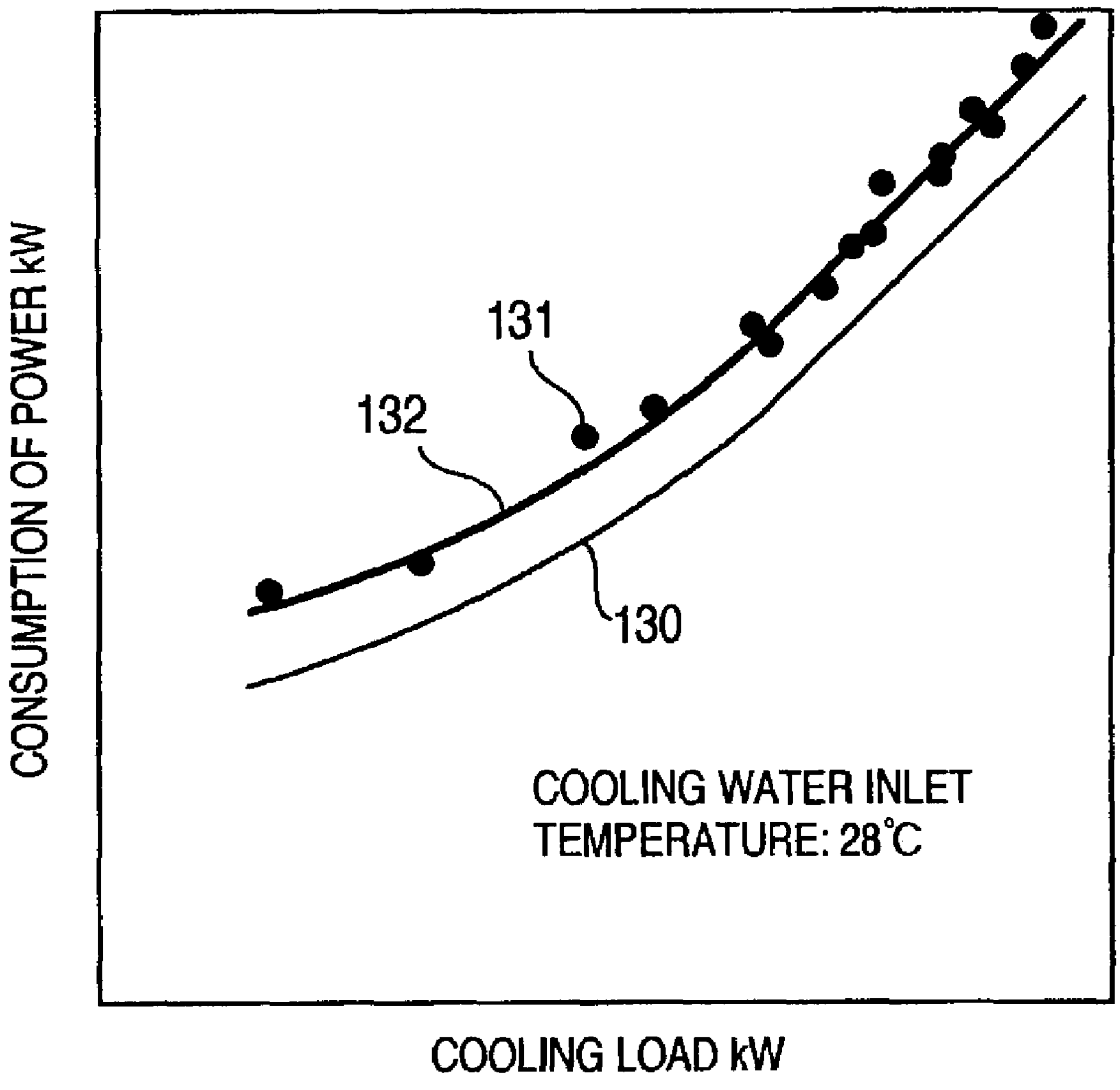
FIG. 14 is a view illustrating consumption of power in the air conditioning equipment.

FIG. 14 shows a example of a change in consumption of power of the turbo freezer 33 with respect to the amount of cooled heat when a cooling water inlet temperature is 28° C. A line 130 indicates a power consumption characteristic measured when the turbo freezer 33 was manufactured. As a result of continuously running the turbo freezer 33, a heat transfer tube of the evaporator is stained by a stain or the like on cooling water, causing a change in the turbo freezer 33 with time. Consequently, power consumption running record data 131 is shifted upward from the initial characteristic line 130. Thus, by interpolating or approximating the running record data, a new power consumption characteristic line 132 is obtained. When this power consumption characteristic line 132 is largely shifted from an initial state, consideration is given to whether maintenance is performed or not. The device characteristic correcting means 43 executes such a change. Similarly, when it is determined from the running record data that a change occurred in the device characteristic data prestored for the absorption freezer 32 or the other device because of a change with time or the like, the device characteristic correction means 43 corrects the stored characteristic data.

Figure 15:
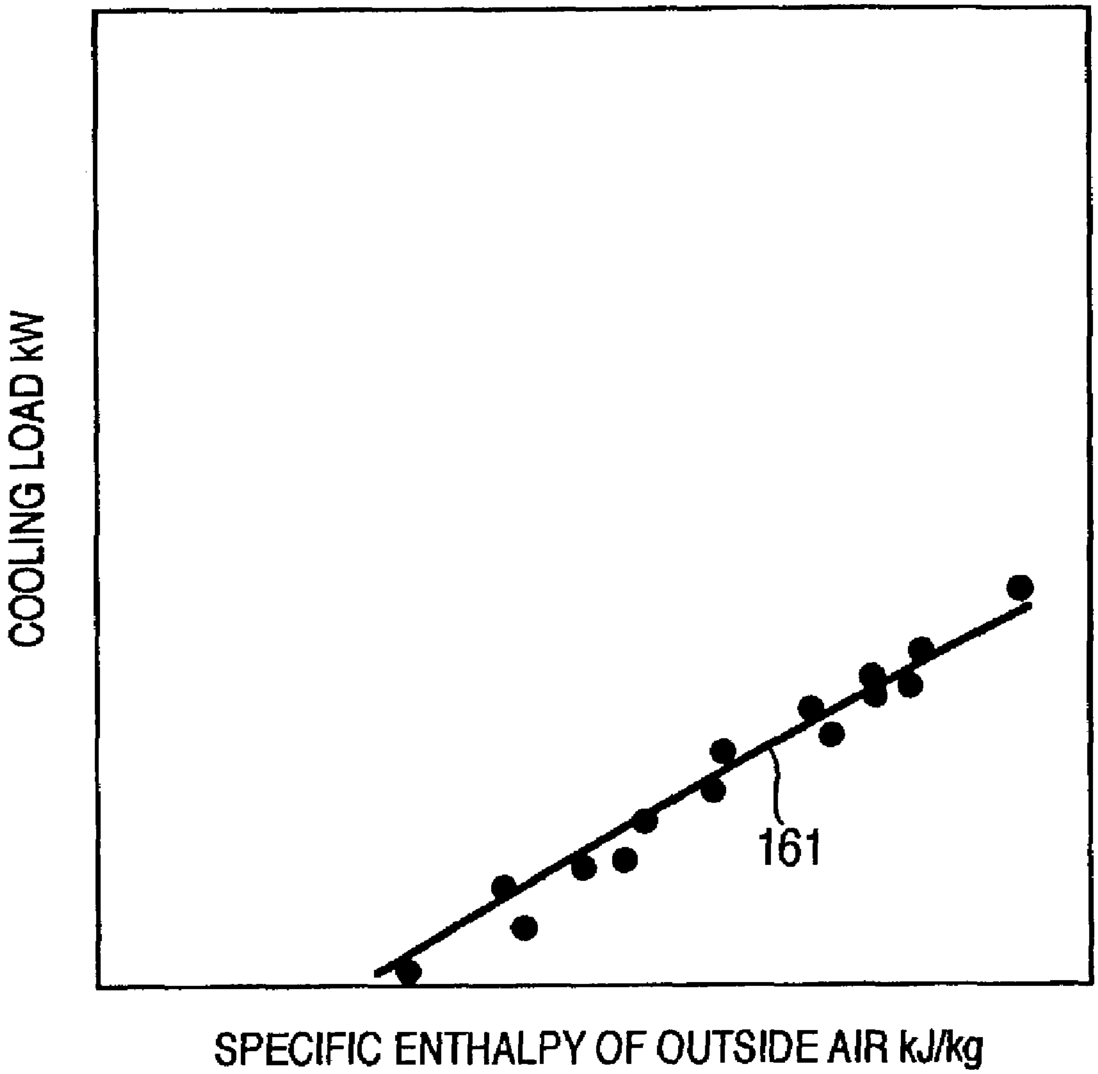
FIG. 15 is a view illustrating load fluctuation.

FIG. 15 shows an example of a change in a cooling load of the cooling coil 424 with respect to a specific enthalpy of an outside air obtained by plotting the running record data. The specific enthalpy of the outside air is calculated from measurement values of the thermometer 800 and the hygrometer 850 installed in the instrument screen 300, and a cooling load of the introduced outside air is calculated based on detected values of the temperature sensors 811 and 812 and the flow meter 832. It can be seen that the cooling load of the introduced outside air cooled by the cooling coil has a linear relation 161 with the specific enthalpy of the outside air. This relation 161 is obtained by approximating the running record data by at least a square. This approximation equation is used for calculating the predicted value of the cooling load in step 802S of the operation plan optimization algorithm shown in FIG. 9. Also, it is used for replacement consideration described later.

The cooling loads 974 and 975 of the dry coil cooling water and the device cooling water shown in FIG. 7 are substantially constant as long as no changes occur in a production volume or production equipment. Accordingly, an average value is obtained from the running record data among production systems. In the example of the air conditioning equipment shown in FIG. 3, the cooling load 974 of the dry coil cooling water is calculated from the detected values of the temperature sensors 814 and 816, and the flow meter 833. Similarly, the cooling load 975 of the production device cooling water is calculated from the detected values of the temperature sensors 820 and 821, and the flow meter 834. When the predicted value of the cooling load is obtained by using the running plan optimization algorithm shown in FIG. 9 in step 802S, if a production state is considered to be similar to that of a previous day, values of the previous day may be used for the cooling loads 974 and 97 of the dry coil cooling water and the production device cooling water.

When a highly efficient device is developed or a great change occurs from the cooling load during the designing of the air conditioning equipment, replacement of the equipment is considered according to the flow shown in FIG. 13. Here, description is made only of a difference between replacement consideration and equipment designing.

The cooling load 975 of the introduced outside air is obtained from the drawing of the cooling load of the introduced outside air with respect to the specific enthalpy of the outside air, the example of which is shown in FIG. 14, prepared by the device characteristic correction means 43. The cooling loads 974 and 973 of the dry coil cooling water and the device cooling water are obtained from the past running record data. An annual change in the temperature and humidity of the outside air is obtained from the past data on the temperature and humidity of the outside air as in the case of equipment designing. By using these values, in step 901, an annual cooling load pattern is formed.

Total costs for the number of years set in the current equipment are calculated. In this case, initial costs are assumed to be 0. Steps 905 to 911 of FIG. 13 are executed as in the case of equipment designing. Returning to step 902, if changes are necessary, the flow of the air conditioning equipment is changed in step 902, and the type of each device, and the number of devices are changed in step 903.

If replacement is assumed, initial costs are set as costs necessary for the replacement. In step 904, costs necessary for the replacement are calculated. Steps 905 to 911 are executed as in the case of equipment designing. When total costs in the case of replacement are lower than total costs of the current equipment, since replacement costs can be recovered in a period shorter than the number of years previously set in step 907, the replacement is carried out.

Figure 16:
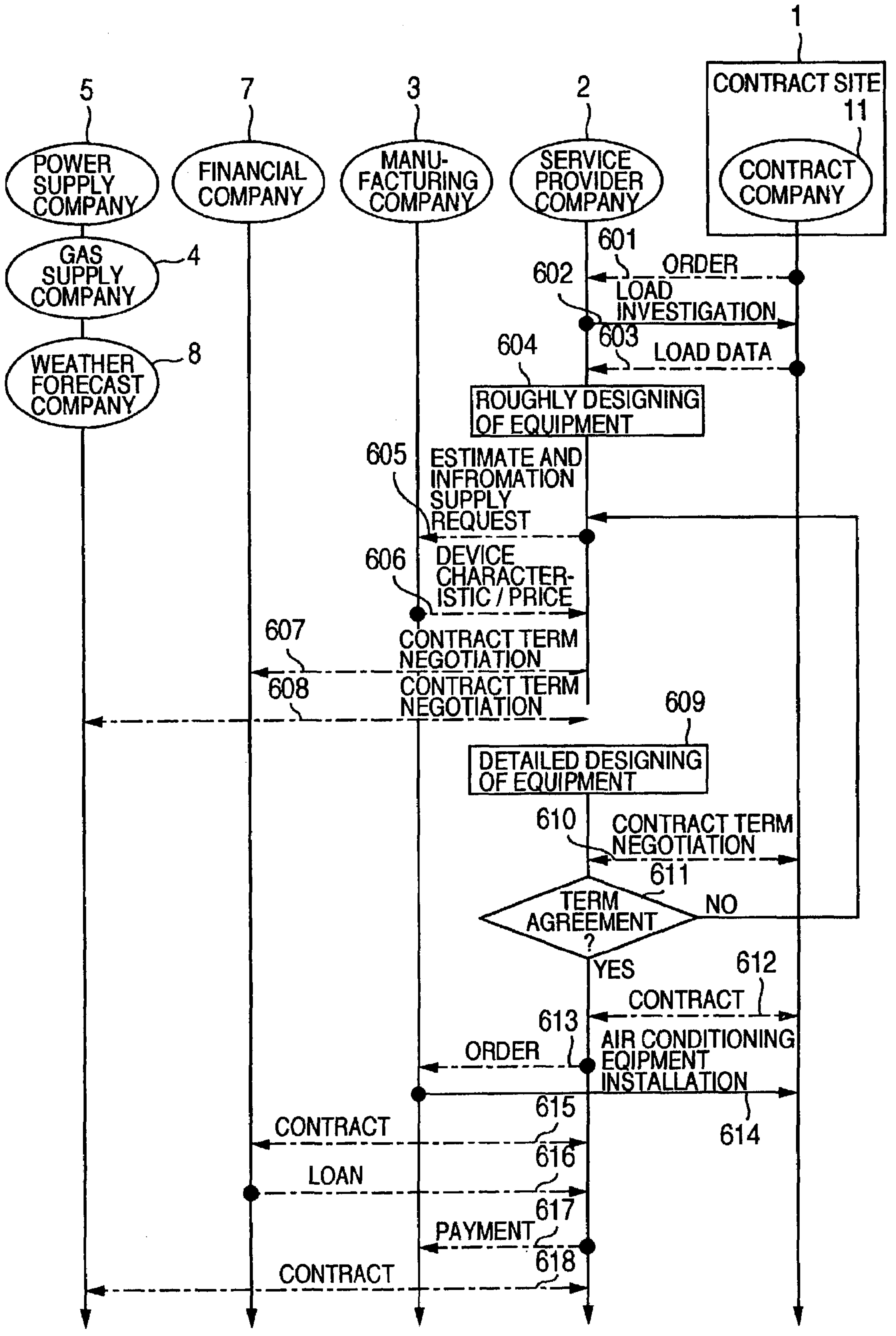
FIG. 16 is a view illustrating privity of contract between companies.
Figure 17:
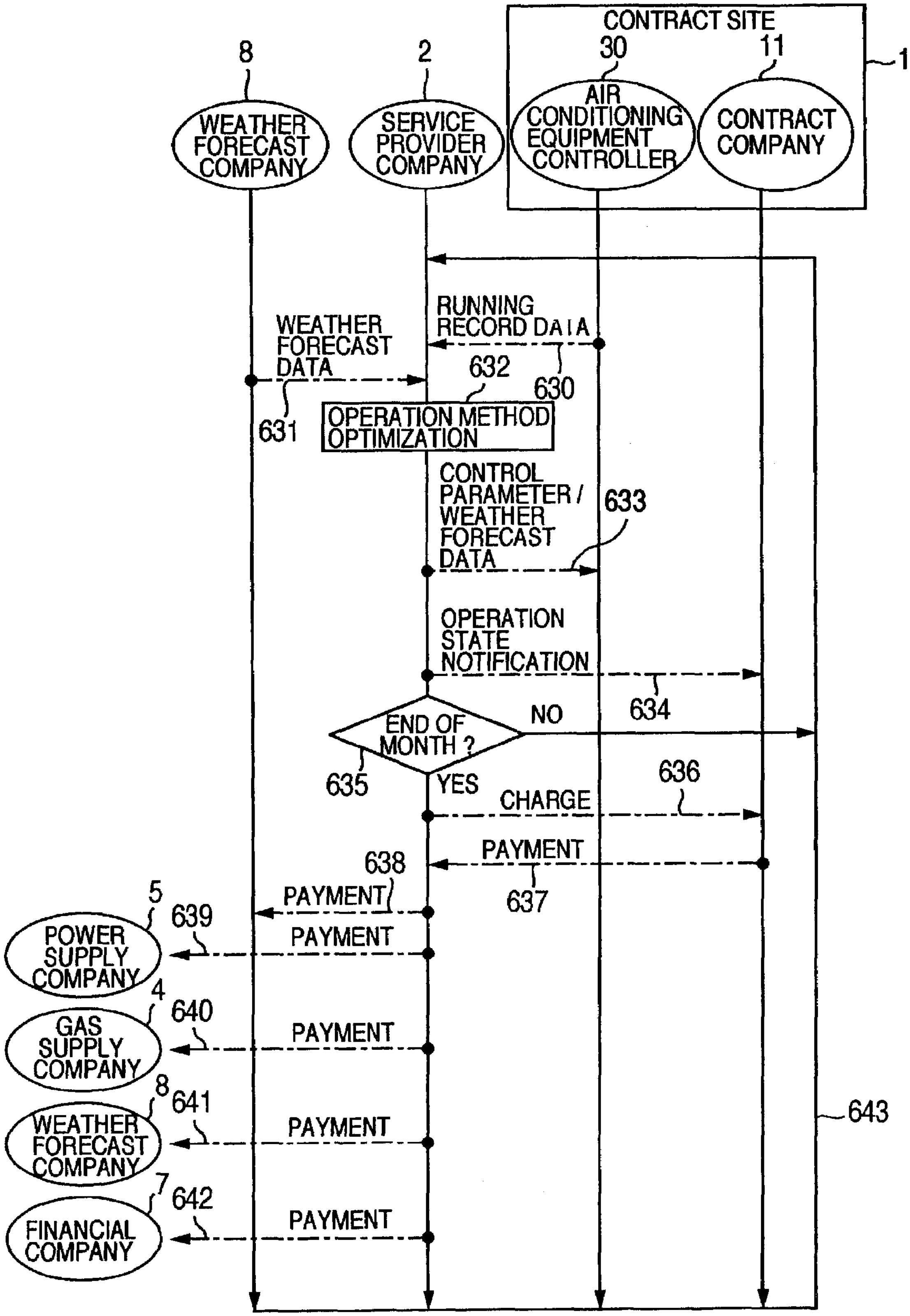
FIG. 17 is a view illustrating privity of contract between companies.

Each of FIGS. 16 and 17 shows a procedure when a contract is started. The service provider company 2 owns the air conditioning equipment 39 and the air conditioning equipment management controller 30. The service provider company 2 supplies cold water to the contract company 11, and receives payment from the contact company 11 according to the supplied amount of cold water. Accordingly, the contract company 11 can conserve energy and save costs for the air conditioning equipment without making any initial investments. In FIG. 16, upon receiving an order from the contract company 11 (601), the service provider company 2 investigates a cooling load of the contract site 1 (602), and obtains cooling load data (603). In this case, running costs of existing air conditioning equipment are investigated, and running costs per a unit amount of heat for the equipment are calculated. The service provider company 2 roughly designs air conditioning equipment (604), requests a manufacturing company 3 to provide information regarding a device characteristic or the like of a constituting device, and an estimate (605), and receives the information (606). The service provider company 2 negotiates a load of fund for buying the devices with a financial company 7 (607). In addition, the service provider company 2 negotiates contract terms for a power supply condition and a rate, a gas supply condition and a rate, and weather forecast supply condition with the power supply company 5, the gas supply company 4, and the weather forecast company 8 (608).

The service provider company 2 designs equipment in detail by using the equipment designing support means 45, and makes contract terms (609). The service provider company 2 negotiates contract terms with the contract company 11 (610). If no agreement is reached on the contact terms, then the process returns to 605 for reexamination. If an agreement is reached on the contract terms, contracts are established (611, and 612).

If the contract company 11 has existing air conditioning equipment, and parts thereof are used, the service company 2 buys a device to be used from the contract company 11 or makes a lease contract (612). The service provider company 2 orders air conditioning equipment to the manufacturing company 3 (613), and installs the air conditioning equipment 39 and the air conditioning equipment management controller 30 in the contract site 1 (614). Moreover, the service provider company 2 makes a load contract with the financial company 7 for payment of the air conditioning equipment 39 and the air conditioning equipment management controller 30 (615), and obtain a loan from the financial company 7 (616).

The service provider company 2 pays for the air conditioning equipment 39 and the air conditioning equipment management controller 30 to the manufacturing company 3 (617). If the existing air conditioning equipment is bought from the contract company 11, payment is made to the contract company 11. The service provider company 2 makes a power supply contract, a gas supply contract, and weather forecast supply contract with the power supply company 5, the gas supply company 4, and the weather forecast company 8 (618).

FIG. 17 shows a procedure for a normal operation. The service provider company 2 receives the running record data of the air conditioning equipment 39 from the air conditioning equipment management controller 30 installed in the contract site 1 through the network 10. The service provider company 2 receives the weather forecast data from the weather forecast company 8 through the network 10. Then, an operation method of lowest running costs is obtained by using the operation method optimizing means 44. Operation plan data is prepared by using the obtained operation method (632).

The service provider company 2 transmits the prepared operation plan data, and time series data of the weather forecast data received from the weather forecast company to the air conditioning equipment management controller 30 of the contract site 1. Also, the service provider company 2 notifies a operation state to the contract company 11 (634), the operation state including the total amount of heat for cooling, the total amount of heat for heating and the amount of used steam thus far, a rate of use, the amount of heat for cooling and the amount of heat for heating thus far, a change with time in a mass flow rate of steam and the like.

The rate of use is obtained by adding a specific charge to a fixed basic monthly rate, the specific charge being obtained by multiplying an accumulated use amount of heat for cooling or heating and an accumulated use amount of steam with unit prices. The amount of heat for cooling is a sum of the amount of heat (including latent heat during dehumidifying) obtained by cooling air introduced into the outside air conditioner 430 by the cooling coil 424, the amount of heat obtained by cooling air in the clean room 360 by the dry coil 426, and the amount of heat obtained by cooling the production device 411 by device cooling water. The amount of heat for heating is obtained by heating the air introduced into the outside air conditioner 430 by steam distributed in the preheating coil 421 and the reheating coil 425. The steam use amount is the amount of steam used by the humidifier 423.

A basic rate is set low for a contract site where annular cooling load fluctuation is small, while a basic rate is set high for a contract site where annual cooling load fluctuation is large, and a difference between an annual average cooling load and a cooling load at a peak time is large. Alternatively, a basic rate is set higher as a cooling load at a peak time is larger. Basic rates are similarly set for the amount of heated heat and the steam use amount.

Determination is made as to whether it is a rate payment day or not in step 635. If it is not a rate payment day, the process returns to step 630. If it is a rate payment day, then a rate is charged to the contract company 11 in step 636. Then, the service provider company 2 receives payment from the contract company 11 in step 637. The rate charged to the contract company 11 is a result of subtracting a land rental rate or the like from the use rate, that is, subtracting payment to the contract company 11.

The service provider company 2 pays for the weather forecast supply rate to the weather forecast company 8 in step 638. Then, the service provider company 2 pays for the power supply rate to the power supply company in step 639; for the gas rate to the gas supply company in step 640; and for the loan to the financial company 7 in step 641.

Now, description is made of a case where the contract site 1 owns the air conditioning equipment 39. In this case, the service provider company 2 reduces running costs by improving efficiency of the air conditioning equipment 39 of the contract site 1, and the reduced cost amount is divided between the contract company 11 and the service provider company 2. Running costs (yen/MJ) per a unit amount of heat before operation of the service provider company 2 is calculated by the following equation (4):

$$A1=(B1+C1)/D1 \quad (4)$$

In the equation (4), A1 denotes running costs (yen/MJ) per a unit amount of heat before the operation of the service provider company 2; B1 an annual gas rate (yen/year) before the operation of the service provider company 2; C1 an annual power rate (yen/year) before the operation of the service provider company 2; and D1 an annual total amount of cooled heat (MJ/year) before the operation of the service provider company 2. The amount of cooled heat D1 (MJ/year) is a value obtained by measuring performed by a measuring device attached before the service provider company 2 operates the air conditioning equipment. Thus, before the operation start of the service provider company 2, the running costs A1 can be accurately obtained. Instead of measuring the amount of cooled heat, estimation may be made from data owned by the contract company 11. Since it owns various data for the other contract sites, the service provider company 2 can estimate running costs per a unit amount of heat by using data of the other contract sites similar in equipment configuration.

A reduced amount of running costs is calculated by using the following equation (5):

$$M2=D2\times A1-(B2+C2+E2) \quad (5)$$

Here, M2 denotes a reduced amount (yen/month) of running costs of one month; B2 a gas rate (yen/month) of one month; C2 a power rate (yen/month) of one month; E2 other costs (yen/month) including depreciation and interest rates of one month; and D2 a total amount of cooled heat (MJ/year) of one month.

The reduced amount M2 (yen/month) of the running costs obtained as a result of the operation of the service provider company is divided between the contract company 11 and the service provider company 2 at a ratio decided by the contract. Similar calculations are made for the total amount of heated heat and the steam use amount. If an operation state is bad, the reduced amount M2 (yen/month) of the running costs of one month becomes minus. Thus, risk burdens are decided beforehand between the contract company 1 and the service provider company 2.

Figure 18:
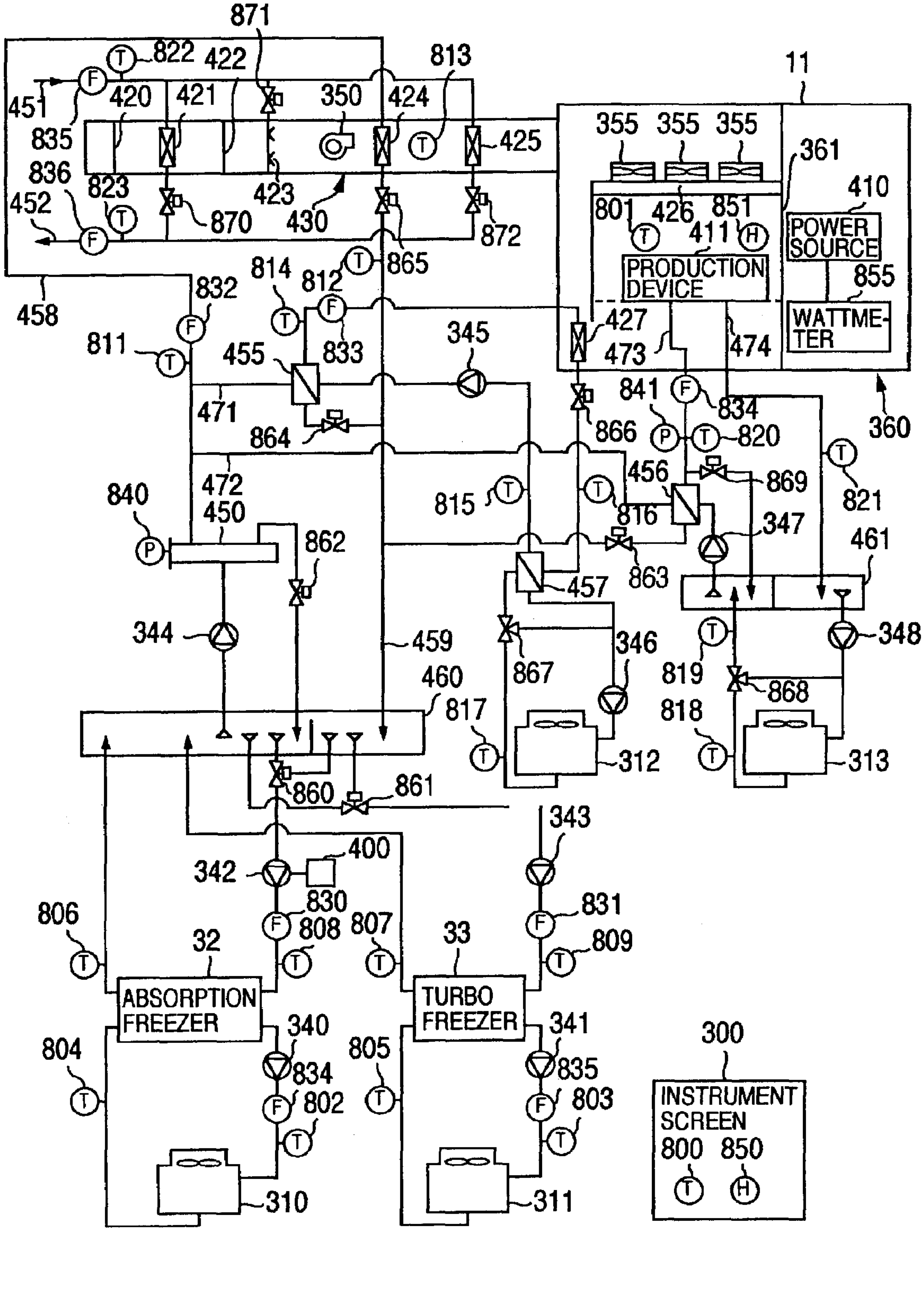
FIG. 18 is a system flowchart of air conditioning equipment according to another embodiment.

FIG. 18 shows another embodiment of the invention. This embodiment is different from the embodiment shown in FIG. 3 is that cooling water of the production device 411, and cooling water of the dry coil 427 disposed in the clean room 360 are heat-exchanged with cooing water circulated in the cooling towers 312 and 313. That is, the cooling water distributed through the dry coil 427 is passed from the valve 866 through the temperature sensor 816, and heat-exchanged with the cooling water circulating in the cooling tower 312 by the heat exchanger 457 to be cooled. The cooled water is passed from the temperature sensor 815 through the dry coil cooling water pump 345, and sent to the dry coil cooling water heat exchanger 455. A three-way valve 867 is provided in the midway of a pipe for the cooling water circulating in the cooling tower 312, and one side of the three-way valve 867 is connected to a bypass pipe of the heat exchanger 457. In the cooling water circulation pipe of the cooling tower 312, a pump 346 and a temperature sensor 817 for detecting a cooling water outlet temperature are provided.

Cooling water having cooled the production device 411 and held in the production device cooling water tank 461 is guided to the cooling tower 313 by a pump 348. The following elements are provided in the pipe of cooling water circulating in the cooling tower 313: a temperature sensor 818 for detecting a temperature out of the cooling tower 313; a three-way valve 868 located downstream of this temperature sensor, and connected to a bypass pipe bypassing the cooling tower 313; and a temperature sensor 819 located downstream of the three-way valve for detecting a temperature of cooling water. The three-way valves 867 and 869 are controlled such that temperatures detected by the temperature sensors 816 and 819 can be equal to set temperatures. In order to prevent temperatures of cooling water in outlets of the cooling towers 312 and 323 from becoming too low, fans of the cooling towers 312 and 313 are subjected to ON/OFF control or rotational speed control according to detected values of the temperature sensors 817 and 818.

In the configuration of the embodiment, the number of cooling towers is increased compared with the case of the configuration of FIG. 3. However, cooling capability can be accordingly increased, making it possible to deal with a sudden demand increase.

Figure 19:
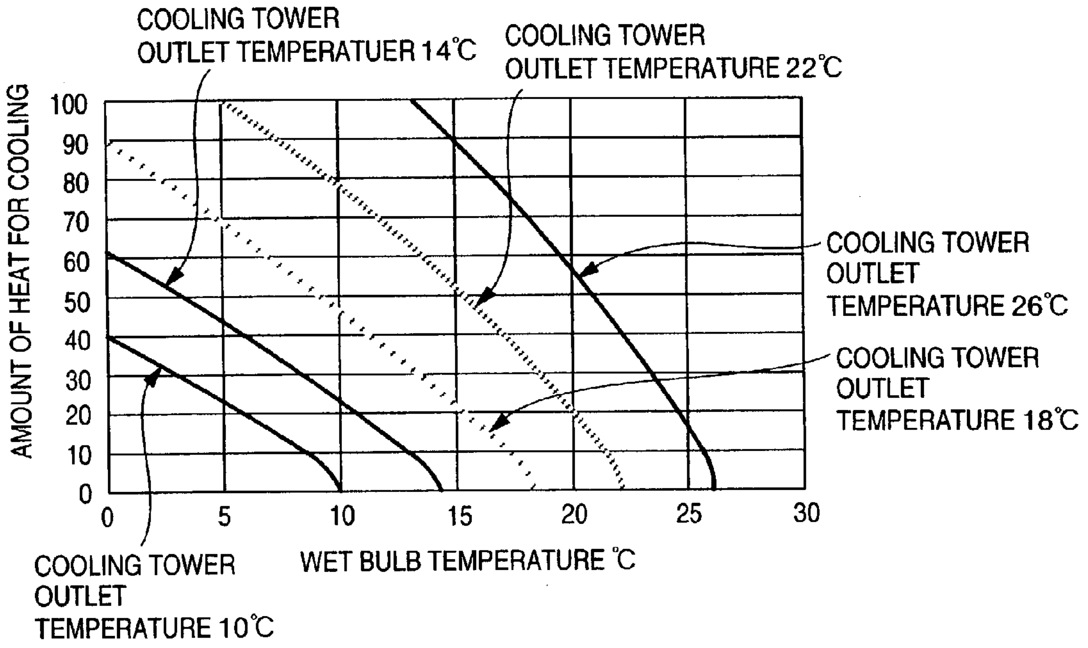
FIG. 19 is a view illustrating an operation of a cooling tower.

FIG. 19 shows a relation between a wet bulb temperature of outside air and an amount of cooled heat detected by the cooling towers 312 and 313. Operation plans are made for the cooling towers 312 and 313 based on changes in a temperature and humidity of the outside air and, based on annual temperature and humidity changes in the contract site, air conditioning equipment is designed in such a way as to reduce total costs.

Figure 20:
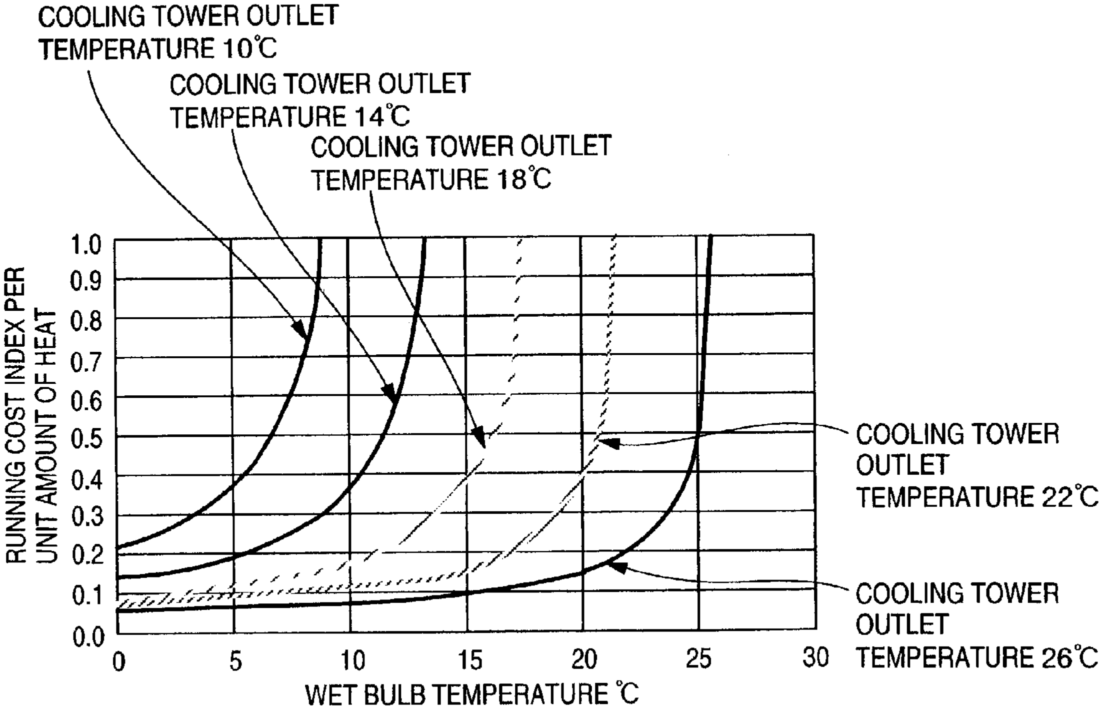
FIG. 20 is a view illustrating running costs of the air conditioning equipment.

FIG. 20 shows a relation between the wet bulb temperature of the outside air and running costs per a unit amount of heat for the cooling towers 312 and 313. The running costs include power consumption of the cooling tower 312 and a circulation pump. As compared with running costs per a unit amount of heat for the absorption and turbo freezers 32 and 33 shown in FIG. 5, running costs per a unit amount of heat for the cooling towers 312 and 313 may be lower depending on a wet bulb temperature of the outside air. In such a case, the cooling towers 312 and 313 are operated to reduce running costs.

To select operation methods of the cooling towers 312 and 313, a combination of an operation and a stop for each of the cooling towers 312 and 313 is made. An optimum operation plan is made according to the operation flow shown in FIG. 9. Specifically, an example when a cooling load X of the freezer becomes 100% or lower is shown.

In the case of $X \leqq 100$,

(11) X1=X, X2=0, the cooling towers 312 and 313 are operated.

(12) X1=0, X2=X, the cooling towers 312 and 313 are operated.

(13) X1=X, X2=0, the cooling tower 312 is operated, but the cooling tower 313 is stopped.

(14) X1=0, X2=X, the cooling tower 312 is operated, but the cooling tower 313 is stopped.

(15) X1=X, X2=0, the cooling tower 312 is stopped, but the cooling tower 313 is operated.

(16) X1=0, X2=X, the cooling tower 312 is stopped, but the cooling tower 313 is operated.

(17) X1=X, X2=0, the cooling towers 312 and 313 are stopped.

(18) X1=0, X2=X, the cooling towers 312 and 313 are stopped.

The operations of the cooling towers 312 and 313 are decided depending on a wet bulb temperature of the outside air. Whether the cooling towers 312 and 313 cane operated or not is decided based on device characteristic data. When the cooling towers 312 and 313 can be operated, amounts of heat to be cooled by the cooling towers 312 and 313 are obtained. A value obtained by subtracting the amount of heat cooled by the cooling towers 312 and 313 from an entire cooling load is set as a cooling load X of the freezer, and target amounts of cooled heat are set for the absorption and turbo freezers 32 and 33.

Figure 21:
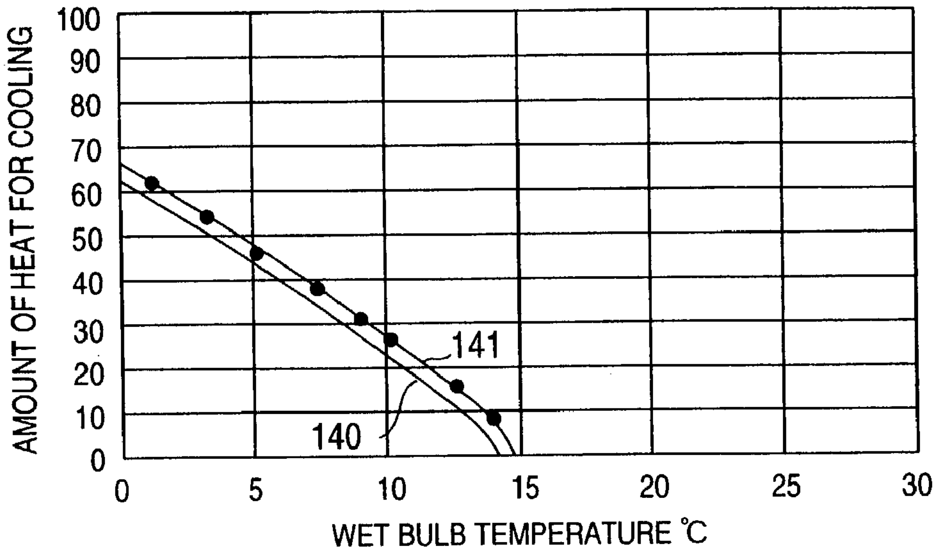
FIG. 21 is a view illustrating an operation of a cooling tower.

FIG. 21 shows a relation between a dew-point temperature and an amount of cooled heat of the cooling tower when a cooling tower outlet temperature is 14° C. A line 140 indicates a characteristic line during manufacturing; and a line 141 a line connecting running record data. When the running record data is shifted by a predetermined amount from the initial characteristic line 140, the characteristic line is corrected to the line 141 obtained from the running record data.

Figure 22:
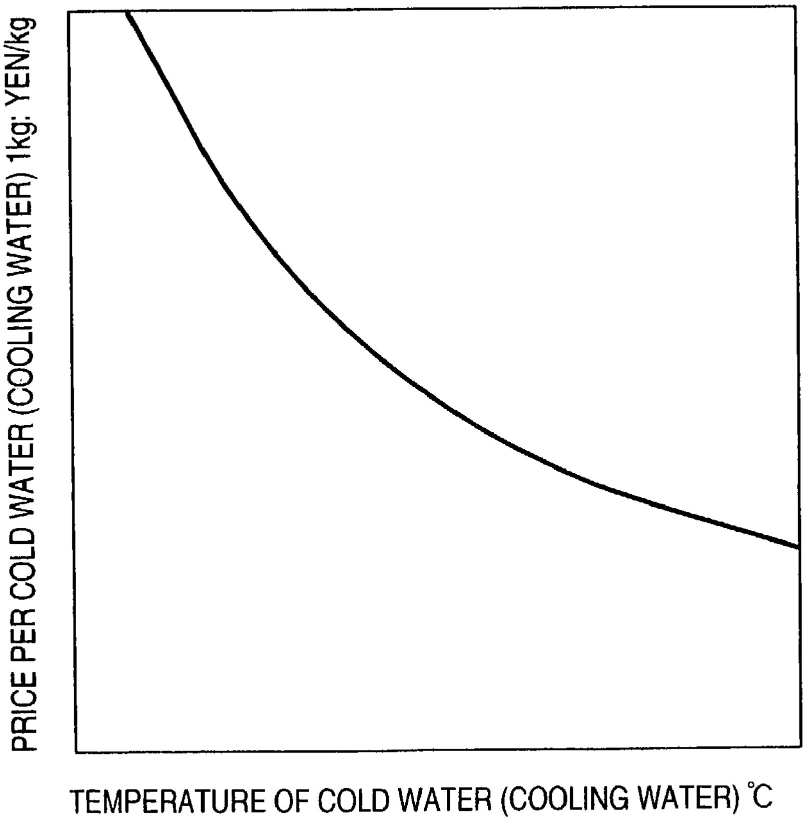
FIG. 22 is a view illustrating cooling costs.

Now, description is made of another method for calculating a specific charge by referring to FIG. 22. FIG. 22 shows a cold water temperature, and a unit price per cold water weight. As a cold water temperature is lower, a cold water unit price is set higher. A reason is that greater energy is necessary for lower temperature cold water. Regarding cooling loads of the cold water coil 424, the dry coil 426, and the production device 411, a specific charge is calculated by the following equation (6):

$$MM=(MM1-MM2)\times WW/60\times TI\times\rho \quad (6)$$

In the equation (6), MM denotes a specific charge (yen) of cold water; MM1 a unit price (yen/kg) corresponding to a temperature of supplied cold water; MM2 a unit price (yen/kg) corresponding to a temperature of returned cold water; WW a flow rate (m3/min.); TI time (s); and ρ a water density (kg/m3).

Now, as a modified example of the embodiment shown in FIG. 18, a case of increasing the respective numbers of cooling towers 310 and 311 is described. In addition to the cooling towers 310 and 311, cooling towers 312 and 313 are increased in number. Accordingly, cold water primary pumps 342 and 343, and cooling water pumps 340 and 341 are also increased in number. Simple combinations lead to an increase in the number of combinations. However, such a number of combinations can be reduced by considering a characteristic of air conditioning equipment.

For example, when a cooling load of the freezer is 280%, by setting the number of freezers to be operated to 4 or more, power supplied to the cold water primary pumps 342 and 343, the cooling water pumps 340 and 341, and the cooling towers 310 and 311 to be operated is increased. However, running costs can be reduced by operating only three of the freezers. Accordingly, an operation combination of freezes is set on the assumption that the three freezers are operated. As a result, it is possible to reduce the number of combinations.

As apparent from the foregoing, according to the present invention, in the air conditioning equipment operation system provided with the plurality of freezers, since the air conditioning equipment is operated by considering a partial load characteristic of each freezer, and a fuel/power rate, an operation is possible, where running costs with respect to a load can be reduced. It is also possible to realize the air conditioning equipment operation system, where total costs including initial and running cots are reduced. Furthermore, it is possible to realize the operation system capable of supplying low-cost cold water.

It should be further understood by those skilled in the art that the following description has been made on embodiments of the invention and that various changes and modifications may be made in the invention without departing from the spirit of the invention and the scope of the appended claims

What is claimed is:

1. An air conditioning equipment support method comprising:

predicting an annular cooling load fluctuation pattern of air conditioning equipment;

determining a plurality of differing air conditioning equipment configurations, and for each differing air conditioning equipment configuration:

calculating initial costs by referring to a device information database having device characteristics and prices of the number of air conditioners;

calculating annual running costs based on the annual cooling load fluctuation pattern by referring to a database storing fuel costs and electricity rates;

calculating other costs including device taxes and interest rates; and calculating total costs including the initial costs, running costs and other costs of a set number or years;

based on the results of the determining, deciding an optimal number of air conditioners of the air conditioning equipment, thereby minimizing the total costs; and providing the results to a user.

2. The air conditioning equipment support method according to claim 1, wherein the annual cooling load fluctuation pattern is predicted by using a weather information database storing weather data on a past temperature and humidity of an outside air.

3. A computer-readable medium having computer-readable code embedded therein which, when executed on a computer, causing said computer to implement an air conditioning equipment support method comprising:

predicting an annular cooling load fluctuation pattern of air conditioning equipment;

determining a plurality of differing air conditioning equipment configurations, and for each differing air conditioning equipment configuration:

calculating initial costs by referring to a device information database having device characteristics and prices of the number of air conditioners;

calculating annual running costs based on the annual cooling load fluctuation pattern by referring to a database storing fuel costs and electricity rates;

calculating other costs including device taxes and interest rates; and calculating total costs including the initial costs, running costs and other costs of a set number or years;

based on the results of the determining, deciding an optimal number of air conditioners of the air conditioning equipment, thereby minimizing the total costs; and providing the results to a user.

4. The computer-readable medium according to claim 1, wherein the annual cooling load fluctuation pattern is predicted by using a weather information database storing weather data on a past temperature and humidity of an outside air.

5. An air conditioning equipment optimization support system comprising:

a processor adapted with software and supportive hardware, for:

predicting an annular cooling load fluctuation pattern of air conditioning equipment;

determining a plurality of differing air conditioning equipment configurations, and for each differing air conditioning equipment configuration:

calculating initial costs by referring to a device information database having device characteristics and prices of the number of air conditioners;

calculating annual running costs based on the annual cooling load fluctuation pattern by referring to a database storing fuel costs and electricity rates;

calculating other costs including device taxes and interest rates; and calculating total costs including the initial costs, running costs and other costs of a set number or years;

based on the results of the determining, deciding an optimal number of air conditioners of the air conditioning equipment, thereby minimizing, the total costs; and providing the results to a user.

6. The system according to claim 1, wherein the annual cooling load fluctuation pattern is predicted by using a weather information database storing weather data on a past temperature and humidity of an outside air.

* * * * *